United States Patent
Ingle et al.

(10) Patent No.: US 7,456,116 B2
(45) Date of Patent: Nov. 25, 2008

(54) GAP-FILL DEPOSITIONS IN THE FORMATION OF SILICON CONTAINING DIELECTRIC MATERIALS

(75) Inventors: Nitin K. Ingle, Santa Clara, CA (US); Shan Wong, San Jose, CA (US); Xinyun Xia, Sunnyvale, CA (US); Vikash Banthia, Mountain View, CA (US); Won B. Bang, Gilroy, CA (US); Yen-Kun V. Wang, Fremont, CA (US); Zheng Yuan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 161 days.

(21) Appl. No.: 11/018,381

(22) Filed: Dec. 20, 2004

(65) Prior Publication Data

US 2005/0142895 A1     Jun. 30, 2005

Related U.S. Application Data

(63) Continuation-in-part of application No. 10/247,672, filed on Sep. 19, 2002, now Pat. No. 6,905,940.

(60) Provisional application No. 60/605,116, filed on Aug. 27, 2004.

(51) Int. Cl.
    *H01L 21/31*     (2006.01)

(52) U.S. Cl. .................. 438/787; 438/788; 438/789; 438/790; 257/E21.273; 257/E21.279

(58) Field of Classification Search ................... None
See application file for complete search history.

(56) References Cited

U.S. PATENT DOCUMENTS 2,861,009 A     11/1958    Rubner (Continued)

FOREIGN PATENT DOCUMENTS

CA           479107          12/1951

(Continued)

OTHER PUBLICATIONS

Fujino et al., "Dependence of Deposition Characteristics on Base Materials in TEOS and Ozone CVD at Atmospheric Pressure," *J. Electrochem. Soc.*, 138(2):550-554 (1991).

(Continued)

*Primary Examiner*—N Drew Richards
*Assistant Examiner*—Kyoung Lee
(74) *Attorney, Agent, or Firm*—Townsend and Towsend and Crew LLP

(57) ABSTRACT

A method to form a silicon oxide layer, where the method includes the step of providing a continuous flow of a silicon-containing precursor to a chamber housing a substrate, where the silicon-containing precursor is selected from TMOS, TEOS, OMTS, OMCTS, and TOMCATS. The method may also include the steps of providing a flow of an oxidizing precursor to the chamber, and causing a reaction between the silicon-containing precursor and the oxidizing precursor to form a silicon oxide layer. The method may further include varying over time a ratio of the silicon-containing precursor:oxidizing precursor flowed into the chamber to alter a rate of deposition of the silicon oxide on the substrate.

16 Claims, 17 Drawing Sheets

U.S. PATENT DOCUMENTS

| | | |
|---|---|---|
| 2,889,704 A | 8/1959 | Pekarek |
| 3,046,177 A | 7/1962 | Hankins |
| 3,048,888 A | 8/1962 | Shockley et al. |
| 3,109,703 A | 11/1963 | Politzer et al. |
| 3,142,714 A | 7/1964 | Politzer et al. |
| 3,166,454 A | 1/1965 | Voelker |
| 4,297,162 A | 10/1981 | Mundt et al. |
| 4,590,042 A | 5/1986 | Drage |
| 4,732,761 A | 3/1988 | Machida et al. |
| 4,792,378 A | 12/1988 | Rose et al. |
| 4,854,263 A | 8/1989 | Chang et al. |
| 4,892,753 A | 1/1990 | Wang et al. |
| 4,962,063 A | 10/1990 | Maydan et al. |
| 4,989,541 A | 2/1991 | Mikoshiba et al. |
| 5,051,380 A | 9/1991 | Maeda et al. |
| 5,089,442 A | 2/1992 | Olmer |
| 5,124,014 A | 6/1992 | Foo et al. |
| 5,204,288 A | 4/1993 | Marks et al. |
| 5,244,841 A | 9/1993 | Marks et al. |
| 5,264,040 A | 11/1993 | Geyling et al. |
| 5,314,845 A | 5/1994 | Lee et al. |
| 5,356,722 A | 10/1994 | Nguyen et al. |
| 5,439,524 A | 8/1995 | Cain et al. |
| 5,474,955 A | 12/1995 | Thakur |
| 5,492,858 A | 2/1996 | Bose et al. |
| 5,567,267 A | 10/1996 | Kazama et al. |
| 5,589,002 A | 12/1996 | Su |
| 5,597,439 A | 1/1997 | Salzman |
| 5,660,472 A | 8/1997 | Peuse et al. |
| 5,710,079 A * | 1/1998 | Sukharev ............... 438/778 |
| 5,728,223 A | 3/1998 | Murakami et al. |
| 5,728,260 A | 3/1998 | Brown et al. |
| 5,789,322 A | 8/1998 | Brown et al. |
| 5,807,785 A | 9/1998 | Ravi |
| 5,812,403 A | 9/1998 | Fong et al. |
| 5,840,631 A | 11/1998 | Kubo et al. |
| 5,939,763 A | 8/1999 | Hao et al. |
| 5,965,203 A * | 10/1999 | Gabric et al. ......... 427/255.23 |
| 5,976,261 A | 11/1999 | Moslehi et al. |
| 5,980,686 A | 11/1999 | Goto |
| 6,001,175 A | 12/1999 | Maruyama et al. |
| 6,013,584 A | 1/2000 | M'Saad |
| 6,024,799 A | 2/2000 | Chen et al. |
| 6,043,136 A | 3/2000 | Jang et al. |
| 6,050,506 A | 4/2000 | Guo et al. |
| 6,079,353 A | 6/2000 | Leksell et al. |
| 6,079,356 A | 6/2000 | Umotoy et al. |
| 6,099,647 A | 8/2000 | Yieh et al. |
| 6,106,663 A | 8/2000 | Kuthi et al. |
| 6,106,678 A | 8/2000 | Shufflebotham et al. |
| 6,133,160 A | 10/2000 | Komiyama et al. |
| 6,136,685 A | 10/2000 | Narwankar et al. |
| 6,140,242 A | 10/2000 | Oh et al. |
| 6,149,987 A * | 11/2000 | Perng et al. ................ 427/579 |
| 6,150,209 A | 11/2000 | Sun et al. |
| 6,150,286 A | 11/2000 | Sun et al. |
| 6,156,114 A | 12/2000 | Bell et al. |
| 6,171,901 B1 | 1/2001 | Blair et al. |
| 6,184,155 B1 | 2/2001 | Yu et al. |
| 6,190,973 B1 | 2/2001 | Berg et al. |
| 6,194,038 B1 | 2/2001 | Rossman |
| 6,197,705 B1 | 3/2001 | Vassiliev |
| 6,203,863 B1 | 3/2001 | Liu et al. |
| 6,206,972 B1 | 3/2001 | Dunham |
| 6,217,658 B1 | 4/2001 | Orczyk et al. |
| 6,218,268 B1 | 4/2001 | Xia et al. |
| 6,232,580 B1 | 5/2001 | Sandhu |
| 6,236,105 B1 | 5/2001 | Kariya |
| 6,239,002 B1 | 5/2001 | Jang et al. |
| 6,245,192 B1 | 6/2001 | Lenz et al. |
| 6,245,689 B1 | 6/2001 | Hao et al. |
| 6,248,397 B1 * | 6/2001 | Ye ............................ 427/167 |
| 6,248,628 B1 | 6/2001 | Halliyal et al. |
| 6,267,074 B1 | 7/2001 | Okumura |
| 6,276,072 B1 | 8/2001 | Morad et al. |
| 6,302,965 B1 | 10/2001 | Umotoy et al. |
| 6,319,849 B1 | 11/2001 | Oda et al. |
| 6,331,494 B1 | 12/2001 | Olson et al. |
| 6,337,256 B1 | 1/2002 | Shim |
| 6,340,435 B1 | 1/2002 | Bjorkman et al. |
| 6,348,421 B1 | 2/2002 | Shu et al. |
| 6,436,193 B1 | 8/2002 | Kasai et al. |
| 6,444,039 B1 | 9/2002 | Nguyen et al. |
| 6,454,860 B2 | 9/2002 | Metzner et al. |
| 6,468,853 B1 | 10/2002 | Balasubramanian et al. |
| 6,475,284 B1 | 11/2002 | Moore et al. |
| 6,479,405 B2 | 11/2002 | Lee et al. |
| 6,489,254 B1 | 12/2002 | Kelkar et al. |
| 6,500,771 B1 | 12/2002 | Vassilev et al. |
| 6,512,264 B1 | 1/2003 | Ogie, Jr. et al. |
| 6,527,910 B2 | 3/2003 | Rossman |
| 6,541,367 B1 | 4/2003 | Mandal |
| 6,541,401 B1 | 4/2003 | Herner et al. |
| 6,565,661 B1 | 5/2003 | Nguyen et al. |
| 6,583,069 B1 | 6/2003 | Vassiliev et al. |
| 6,586,886 B1 | 7/2003 | Katz et al. |
| 6,602,792 B2 | 8/2003 | Hsu |
| 6,617,259 B2 | 9/2003 | Jung et al. |
| 6,624,091 B2 | 9/2003 | Yuan |
| 6,677,712 B2 | 1/2004 | Katz et al. |
| 6,713,127 B2 | 3/2004 | Subramony et al. |
| 6,733,955 B1 | 5/2004 | Geiger et al. |
| 6,734,115 B2 | 5/2004 | Cheung et al. |
| 6,740,601 B2 | 5/2004 | Tan et al. |
| 6,793,733 B2 | 9/2004 | Janakiraman et al. |
| 6,830,624 B2 | 12/2004 | Janakiraman et al. |
| 6,875,558 B1 | 4/2005 | Gaillard et al. |
| 6,905,940 B2 | 6/2005 | Ingle et al. |
| 6,943,091 B2 | 9/2005 | Yu et al. |
| 6,946,358 B2 | 9/2005 | Doris et al. |
| 6,949,447 B2 | 9/2005 | Ahn et al. |
| 7,037,859 B2 | 5/2006 | Ingle et al. |
| 7,141,483 B2 | 11/2006 | Yuan et al. |
| 7,208,425 B2 | 4/2007 | Ingle et al. |
| 7,335,609 B2 | 2/2008 | Ingle et al. |
| 2001/0019860 A1 | 9/2001 | Adachi et al. |
| 2002/0000195 A1 | 1/2002 | Bang et al. |
| 2002/0000196 A1 | 1/2002 | Park |
| 2002/0004282 A1 | 1/2002 | Hong |
| 2002/0006729 A1 | 1/2002 | Geiger et al. |
| 2002/0007790 A1 | 1/2002 | Park |
| 2002/0011215 A1 | 1/2002 | Tel et al. |
| 2002/0050605 A1 | 5/2002 | Jenq |
| 2002/0052128 A1 | 5/2002 | Yu et al. |
| 2002/0102358 A1 | 8/2002 | Das et al. |
| 2002/0168840 A1 | 11/2002 | Hong et al. |
| 2002/0192370 A1 | 12/2002 | Metzner et al. |
| 2003/0019428 A1 | 1/2003 | Ku et al. |
| 2003/0022523 A1 | 1/2003 | Irino et al. |
| 2003/0054670 A1 | 3/2003 | Wang et al. |
| 2003/0057432 A1 | 3/2003 | Gardner et al. |
| 2003/0071304 A1 | 4/2003 | Ogie, Jr. et al. |
| 2003/0073290 A1 | 4/2003 | Ramkumar et al. |
| 2003/0089314 A1 | 5/2003 | Matsuki et al. |
| 2003/0104677 A1 | 6/2003 | Park et al. |
| 2003/0111961 A1 | 6/2003 | Katz et al. |
| 2003/0138562 A1 | 7/2003 | Subramony et al. |
| 2003/0140851 A1 | 7/2003 | Janakiraman et al. |
| 2003/0168006 A1 | 9/2003 | Williams |
| 2003/0201723 A1 | 10/2003 | Katz et al. |
| 2003/0207530 A1 | 11/2003 | Yu et al. |
| 2003/0209323 A1 | 11/2003 | Yokogaki |
| 2004/0003873 A1 | 1/2004 | Chen et al. |
| 2004/0018699 A1 | 1/2004 | Boyd et al. |

| | | | |
|---|---|---|---|
| 2004/0060514 A1 | 4/2004 | Janakiraman et al. | |
| 2004/0083964 A1 | 5/2004 | Ingle et al.. | |
| 2004/0161903 A1 | 8/2004 | Yuan et al. | |
| 2004/0200499 A1 | 10/2004 | Harvey et al. | |
| 2004/0216844 A1 | 11/2004 | Janakiraman et al. | |
| 2004/0224537 A1 | 11/2004 | Lee et al. | |
| 2005/0064730 A1 | 3/2005 | Ingle et al. | |
| 2005/0186755 A1 | 8/2005 | Smythe et al. | |
| 2006/0030165 A1 | 2/2006 | Ingle et al. | |
| 2006/0046427 A1* | 3/2006 | Ingle et al. | 438/424 |
| 2006/0148273 A1 | 7/2006 | Ingle et al. | |

FOREIGN PATENT DOCUMENTS

| | | |
|---|---|---|
| EP | 0 520 519 | 12/1992 |
| JP | 01283375 A | 11/1989 |
| JP | 01294868 A | 11/1989 |
| JP | 4154116 A | 5/1992 |
| JP | 11176593 A | 7/1999 |
| TW | 479315 A | 3/2002 |
| WO | WO 9925895 A1 | 5/1999 |
| WO | WO 00/77831 A2 | 12/2000 |

OTHER PUBLICATIONS

Kwok et al., "Surface Related Phenomena in Integrated PECVD / Ozone-TEOS SACVD Process for Sub-Half Micron Gap Fill: Electrostatic Effects," *J. Electrochem. Soc.*, 141(8):2172-2177 (1994).

Kuo, Yue, "Etch Mechanism In The Low Refractive Index Silicon Nitride Plasma-Enhanced Chemical Vapor Deposition Process," Appl. Phys. Lett., vol. 63, No. 2, pp. 144-146, Jul. 12, 1993.

Lassig, Stephan E. et al., "Intermetal Dielectric Deposition By Electron Cyclotron Resonance Chemical Vapor Deposition (ECR CVD)," pp. cover and 1-21, no date.

Li, Junling et al., "Modeling Studies Of The Mechanisms In Biased ECR CVD," 3 pages, no date.

Machida, Katsuyuki et al., "SiO2 Planarization Technology With Biasing And Electron Cyclotron Resonance Plasma Deposition For Submicron Interconnections," J Vac. Sc. Technol. B, vol. 4, No. 4, pp. 818-821, Jul./Aug. 1986.

Applied Materials Website Printout: "SACVD (Sub-Atmospheric Chemical Vapor Deposition)" from www.appliedmaterials.com/products/sacvd.html, printed Jun. 20, 2003.

Baker, F. et al. "STI TEOS Densification for Furnaces and RTP Tools" 1999 IEEE/SEMI Advanced Semiconductor Manufacturing Conference, 1999, pp. 394-399.

Definitions of "furnace", Merriam-Webster Online, 2006.

Romanelli, Alex, Semiconductor International website article: AMD Details 45nm Technology, at www.e-insite.net/semiconductor/; Jun. 12, 2003.

* cited by examiner

GAP-FILL DEPOSITIONS IN THE FORMATION OF SILICON CONTAINING DIELECTRIC MATERIALS

CROSS-REFERENCES TO RELATED APPLICATIONS

This application is a continuation-in-part of U.S. patent application Ser. No. 10/247,672, entitled "METHOD USING TEOS RAMP-UP DURING TEOS/OZONE CVD FOR IMPROVED GAP-FILL," filed Sep. 19, 2002 by Nitin K. Ingle, Xinyua Xia, and Zheng Yuan, the entire contents of which is herein incorporated by reference for all purposes. This application also claims the benefit of U.S. Provisional Patent Application No. 60/605,116, entitled "IMPROVED GAP-FILL DEPOSITIONS INTRODUCING HYDROXYL-CONTAINING PRECURSORS IN THE FORMATION OF SILICON CONTAINING DIELECTRIC MATERIALS," filed Aug. 27, 2004 by Nitin K. Ingle, Shan Wong, Xinyun Xia, Vikash Banthia, Won B. Bang, and Yen-Kun V. Wang, the entire disclosure of which is also herein incorporated by reference for all purposes.

BACKGROUND OF THE INVENTION

The fabrication sequence of integrated circuits often includes several patterning processes. The patterning processes may define a layer of conductors, such as a patterned metal or polysilicon layer, or may define isolation structures, such as trenches. In many cases the trenches are filled with an insulating, or dielectric, material. This insulating material can serve several functions. For example, in some applications the material serves to both electrically isolate one region of the IC from another, and electrically passivate the surface of the trench. The material also typically provides a base for the next layer of the semiconductor to be built upon.

After patterning a substrate, the patterned material is not flat. The topology of the pattern can interfere with or degrade subsequent wafer processing. It is often desirable to create a flat surface over the patterned material. Several methods have been developed to create such a flat, or "planarized", surface. Examples include depositing a conformal layer of material of sufficient thickness and polishing the wafer to obtain a flat surface, depositing a conformal layer of material of sufficient thickness and etching the layer back to form a planarized surface, and forming a layer of relatively low-melting point material, such as doped silicon oxide, and then heating the wafer sufficiently to cause the doped silicon oxide to melt and flow as a liquid, resulting in a flat surface upon cooling. Each process has attributes that make that process desirable for a specific application.

As semiconductor design has advanced, the feature size of the semiconductor devices has dramatically decreased. Many circuits now have features, such as traces or trenches less than a micron across. While the reduction in feature size has allowed higher device density, more chips per wafer, more complex circuits, lower operating power consumption and lower cost among other benefits, the smaller geometries have also given rise to new problems, or have resurrected problems that were once solved for larger geometries.

An example of the type of manufacturing challenge presented by sub-micron devices is the ability to completely fill a narrow trench in a void-free manner. To fill a trench with silicon oxide, a layer of silicon oxide is first deposited on the patterned substrate. The silicon oxide layer typically covers the field, as well as walls and bottom of the trench. If the trench is wide and shallow, it is relatively easy to completely fill the trench. As the trench gets narrower and the aspect ratio (the ratio of the trench height to the trench width) increases, it becomes more likely that the opening of the trench will "pinch off".

Pinching off a trench may trap a void within the trench. FIG. 1 shows such a void 4 formed in the dielectric material 2 that fills trench 1. These voids commonly occur in gapfill depositions where dielectric materials are rapidly deposited in high aspect ratio trenches. Void 4 creates inhomogeneities in the dielectric strength of the gapfill that can adversely affect the operation of a semiconductor device.

One approach to forming fewer voids is to slow down the dielectric deposition rate. Slower deposition rates facilitate a more conformal deposition of the dielectric material on the trench surfaces, which reduces excess buildup of dielectric materials on the top corners of the trench that can result in pinching off. As a result, trenches are more evenly filled from the bottom up. However, lowering the deposition rate of the dielectric material also reduces process efficiency by increasing the total dielectric deposition time. The slower dielectric deposition rates not only increase the time for filling trench 1, but also the bulk dielectric layer 3 on top of trench 1.

Another challenge encountered in gap-fill processes is the formation of weak seams at the interface of the dielectric material with a trench surface, as well as between surfaces of the dielectric materials itself. Weak seams can form when the deposited dielectric materials adhere weakly, or not at all, to the inside surfaces of a trench. Subsequent process steps (e.g., annealing) can detach the dielectric material from the trench surface and create a fissure in the gap-filled trench. Weak seams can also be formed between dielectric surfaces as illustrated in FIG. 2A, which shows a weak seam 9 in the middle of trench 5 that has been formed at the intersection of opposite faces of silicon oxide material 6 growing outward from opposite sidewalls (7a and 7b) of trench 5.

The dielectric material along seam 9 has a lower density and higher porosity than other portions of the dielectric material 6, which can cause an enhanced rate of etching along the seam 9. FIG. 2B illustrates how unwanted dishing 8 can develop along seam 4 when the dielectric material 6 is exposed to an etchant (e.g., HF) during processes such as chemical-mechanical polishing (CMP) and post-CMP cleaning. Like voids, weak seams create inhomogeneities in the dielectric strength of the gapfill that can adversely affect the operation of a semiconductor device.

In some circumstances, voids and weak seams in dielectric trench fills may be filled in or "healed" using a reflow process. For example, some doped silicon oxide dielectric materials experience viscous flow at elevated temperatures, permitting the reduction of voids and weak seams with high-temperature reflow processes. However, as the trench becomes narrower, it becomes more likely that the void will not be filled during these reflow process. In addition, reflow processes are not practical in many applications where high melting point dielectrics, such as undoped silicon oxide, are used for the gapfill. Thus, there remains a need for new systems and methods to reduce or eliminate voids and weak seams in dielectric gapfills.

BRIEF SUMMARY OF THE INVENTION

Embodiments of the invention include methods to form a silicon oxide layer, where the methods include the step of providing a continuous flow of a silicon-containing precursor to a chamber housing a substrate, where the silicon-containing precursor is selected from TMOS, TEOS, OMTS, OMCTS, and TOMCATS. The methods may also include the steps of providing a flow of an oxidizing precursor to the chamber, and causing a reaction between the silicon-containing precursor and the oxidizing precursor to form a silicon oxide layer. In addition, the methods include varying over time a ratio of the silicon-containing precursor:oxidizing precursor flowed into the chamber to alter a rate of deposition of the silicon oxide on the substrate.

Embodiments of the invention also include substrate processing apparatuses that include a processing chamber, and a substrate support configured to support a substrate within the processing chamber. The apparatuses may also include a precursor delivery system configured to receive a silicon-containing precursor and an oxidizing precursor and to deliver the silicon-containing precursor and the oxidizing precursor to the processing chamber. The silicon-containing precursor is selected from the group consisting of TMOS, TEOS, OMTS, OMCTS, and TOMCATS. The apparatuses may further include a controller configured to control the precursor delivery system and the substrate support, where the controller is operable to (i) direct the precursor delivery system to introduce the silicon-containing precursor and the oxidizing precursor into processing chamber at a first relative concentration, and (ii) direct the precursor deliver system to vary the concentration of the silicon-containing precursor relative to the oxidizing precursor over time to deposit silicon oxide on the substrate, as the silicon-containing precursor is continuously flowed into the chamber.

Embodiments of the invention still further include a chemical vapor deposition method for forming a dielectric material in a trench formed on a substrate. The method includes flowing a silicon-containing precursor into a process chamber housing the substrate, flowing an oxidizing gas into the chamber, and providing a hydroxyl-containing precursor in the process chamber. The method also includes reacting the silicon-containing precursor, oxidizing gas and hydroxyl-containing precursor to form the dielectric material in the trench. The ratio of the silicon-containing precursor to the oxidizing gas flowed into the chamber is increased over time to alter a rate of deposition of the dielectric material.

The method may also include increasing, over time, a ratio of the silicon-containing precursor to the hydroxyl-containing precursor flowing into the chamber. The hydroxyl-containing precursor may include water and/or hydrogen peroxide. The step of providing the hydroxyl-containing precursor in the processing chamber may include combusting hydrogen and oxygen in the chamber to form in-situ generated steam (ISSG). Alternatively, the process of providing the hydroxyl-containing precursor in the process chamber may include injecting the water into the process chamber, or bubbling a carrier gas through water to form a wet carrier gas and flowing the wet carrier gas into the chamber. The carrier gas may be the oxidizing gas. The water may be provided to the chamber at a flow rate of about 10 grams/minute.

In addition, a dopant precursor may flow into the chamber at the same or a different time than the other precursor gases. The dopant may be triethylborate (TEB), triethylphosphate (TEPO), or diborane, among other dopants.

The dielectric material may be formed in trench at a temperature of about 500° C. to about 600° C. The annealing of the dielectric material in the trench may be done at a temperature of about 800° C. to about 1400° C.

Embodiments of the invention also include a chemical vapor deposition method for forming a dielectric layer on a substrate. The method includes providing a silicon-containing precursor, an oxidizing processing gas, and a hydroxyl-containing precursor to a chamber housing the substrate. These precursors react to form the dielectric layer on the substrate. The ratio of the silicon-containing precursor to the oxidizing processing gas flowed into the chamber may be altered to change the deposition rate of the dielectric layer. The method may also include annealing the dielectric layer to increase a density of the dielectric layer. Also, the ratio of the silicon-containing precursor to the oxidizing processing gas may be varied by increasing a flow rate of the silicon-containing precursor relative to a flow rate of the oxidizing processing gas.

Embodiments of the invention further include a substrate processing apparatus. The apparatus may include a substrate support configured to support a substrate within a processing chamber, and a gas delivery system configured to receive a silicon-containing precursor, a hydroxyl-containing precursor and an oxidizing processing gas and deliver them to the processing chamber. The apparatus may further include a controller configured to control the gas delivery system and the substrate support. The controller may introduce the silicon-containing precursor, the hydroxyl-containing precursor and oxidizing processing gas into the processor chamber to form a dielectric layer on the substrate, and alter the position of the substrate support relative to the gas delivery system during the deposition of the dielectric layer.

The controller may also vary the concentration of the silicon-containing precursor to the oxidizing processing gas over time during the deposition of the dielectric layer on the substrate, as the silicon-containing precursor gas is continuously flowed into the chamber. In addition, the controller may move the substrate support closer to the gas delivery system during the deposition of the dielectric layer to increase a deposition rate for the dielectric layer. Embodiments of a substrate processing apparatus may also include a gas delivery system having separate channels to deliver the silicon-containing precursor and the hydroxyl-containing precursor to the processing chamber.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION OF THE INVENTION

Figure 1:
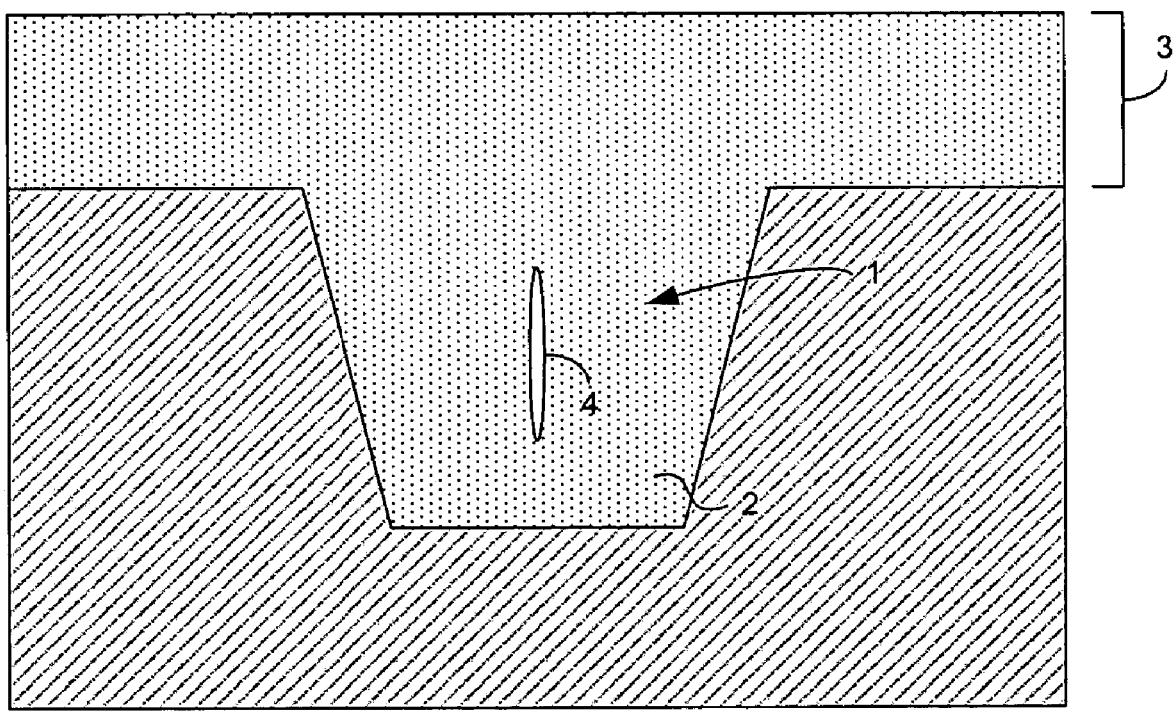
FIG. 1 shows a trench filled with a dielectric material that includes a void.
Figure 2A:
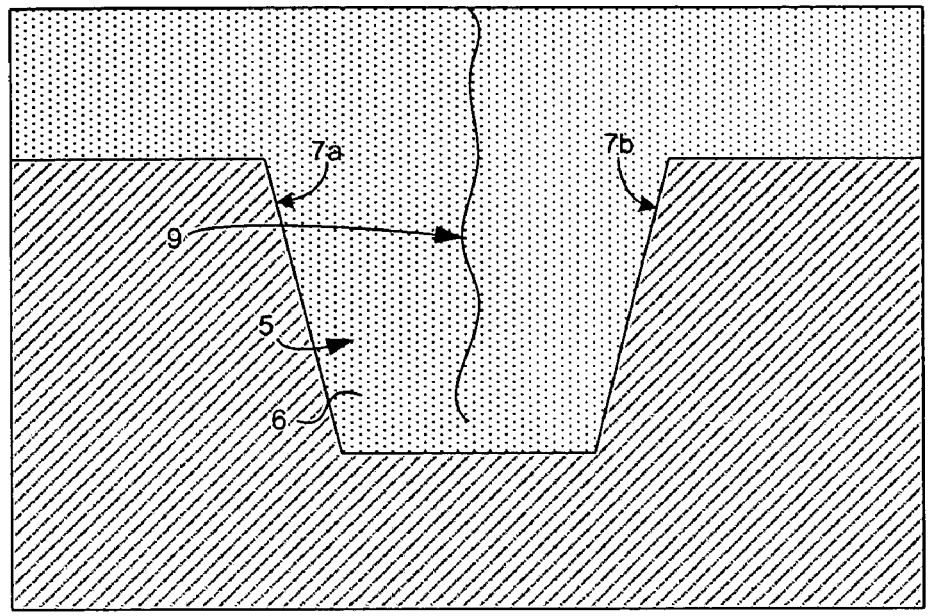
FIG. 2A shows a trench filled with a dielectric material that includes a weak seam.
Figure 2B:
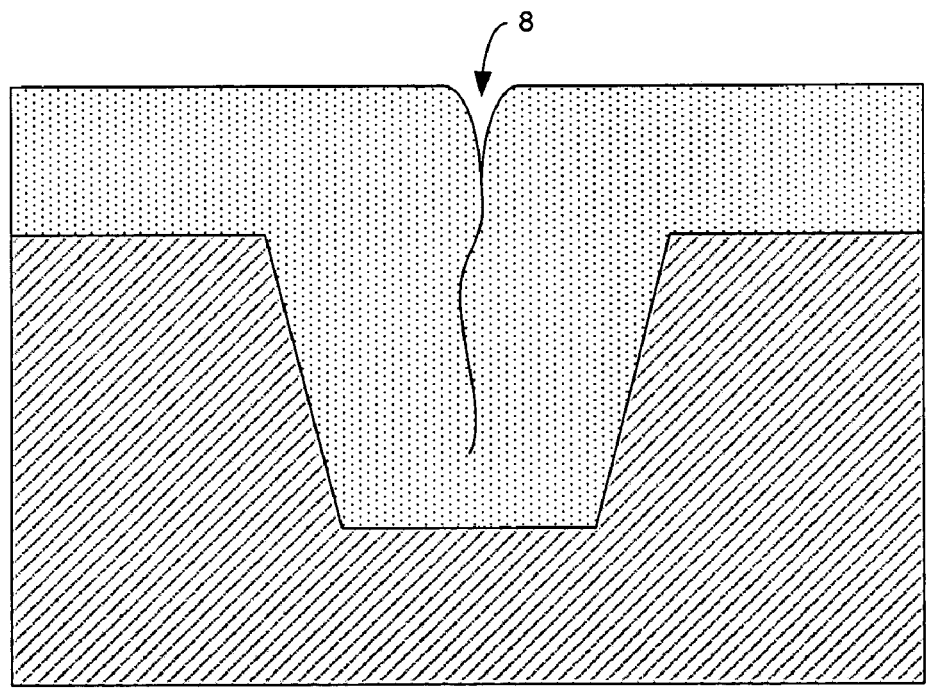
FIG. 2B shows the conventional oxide-filled trench of FIG. 2A after a chemical mechanical polishing.

As noted above, the development of voids and weak seams in trench isolations has become an increasing problem, particularly as trench widths get smaller (e.g., about 90 nm or less) and trench aspect ratios get higher (e.g., about 6:1 or higher). The present invention includes systems and methods of forming dielectric materials in these trenches using a high-aspect ratio process (HARP). In some embodiments, HARP may include the use of a hydroxyl-containing precursor (e.g., $H_2O$, hydrogen peroxide ($H_2O_2$), etc.) to help reduce voids and weak seams in the gapfill. The hydroxyl-containing precursor enhances the flowability and density of the silicon oxide material, helping to heal weak seams and fill in voids formed during the deposition.

Hydroxyl-containing precursors also increase the density of the silicon oxide material formed in the trench. The higher density of the material may provide advantages over less dense material, including giving the material a slower wet etch rate. Less dense materials deposited in the trenches by, for example, conventional, moisture free chemical vapor deposition typically have wet etch rates of about 5:1 or more. The high wet etch rates of the material can result in the overetching during subsequent planarization and/or oxide etching processes. This overetching may result in the formation of bowls or gaps at the tops of the trench isolations.

Embodiments of the invention include depositing the dielectric materials using high aspect ratio processes (HARPs). These processes include depositing the dielectric material at different rates in different stages of the process. For example, a lower deposition rate may be used to form a more conformal dielectric layer in a trench, while a higher deposition rate is used to form a bulk dielectric layer above the trench. In other examples, multiple rates (e.g., 3 or more rates) are used at various stages of the formation of the dielectric layer. Performing the deposition at a plurality of dielectric deposition rates reduces the number of voids and weak seams in the trenches without significantly reducing the efficiency of the deposition process. In additional embodiements, HARP may include hydroxyl-containing precursors that permit the efficient formation of low defect, high-density dielectric materials in trenches and bulk dielectric layers.

Exemplary Oxide Deposition Processes

The present invention provides methods, apparatuses, and devices related to chemical vapor deposition of silicon oxide.

In one embodiment, a single-step deposition process is used to efficiently form a silicon oxide layer with good gap-filling properties. During a pre-deposition gas flow stabilization stage and an initial deposition stage, a relatively low ratio of silicon-containing gas:ozone is flowed, resulting in the formation at relatively slow rates of silicon oxide exhibiting a highly conformal character. Over the course of the process step, the ratio of silicon-containing gas:ozone is increased to deposit less-conformal oxide material at relatively rapid rates during later stages.

Figure 3:
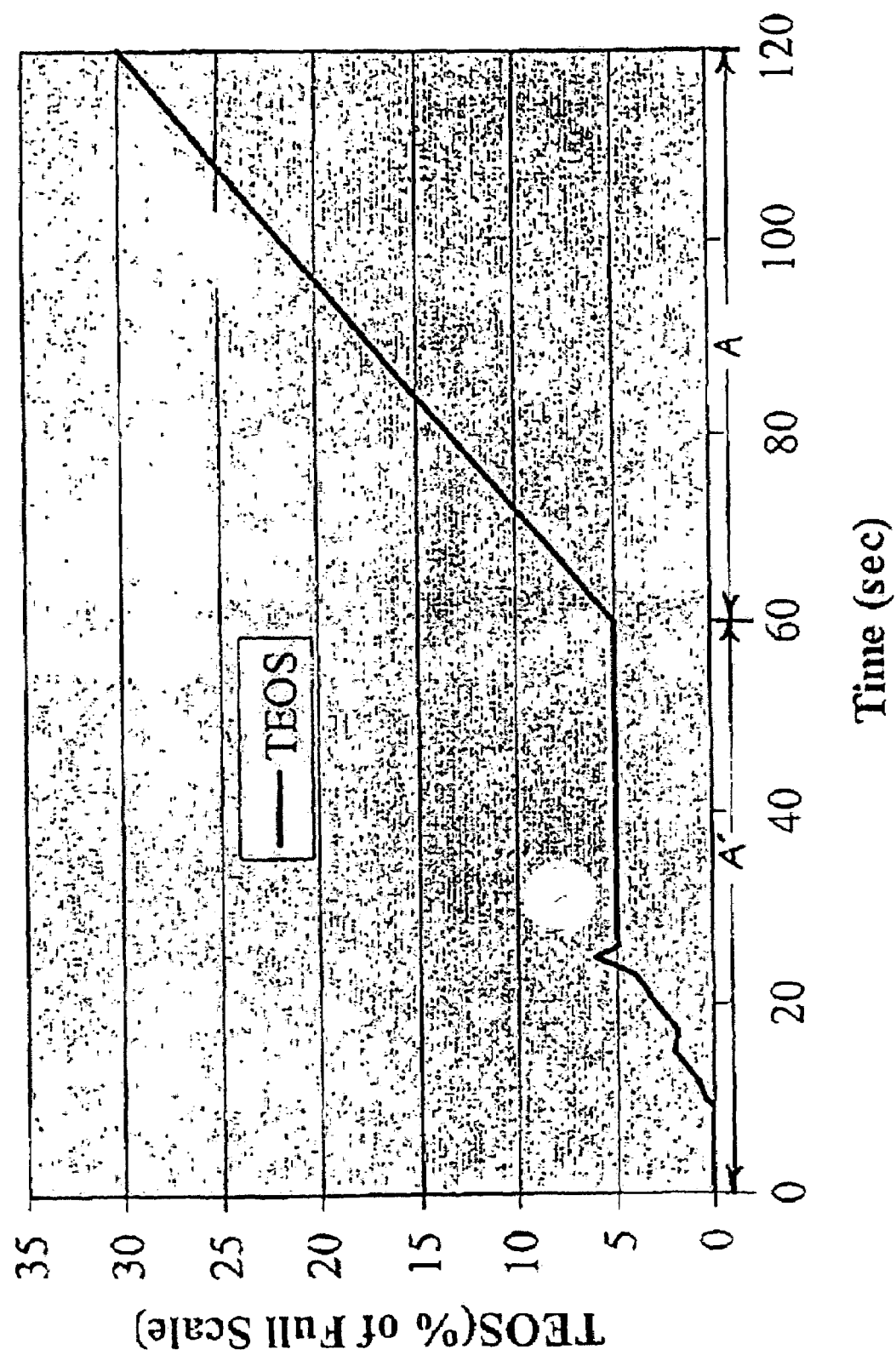
FIG. 3 plots the percentage composition of TEOS in the processing gas mixture flowed during pre-deposition and initial deposition phases of one embodiment of a process in accordance with the present invention.

FIG. 3 plots the percentage of TEOS flowed in the processing gas relative to a maximum TEOS level, versus time for initial phases of an embodiment of a deposition process in accordance with the present invention. Specifically, FIG. 3 illustrates that it is difficult to reliably and controllably ramp up a flow rate of TEOS from a set point of zero. At very small set points, typically less than 5% of the full range, the TEOS flow is not properly regulated by the liquid flow meter that supplies liquid TEOS to the vaporizer. This inconsistent flow profile can lead to unwanted variation in deposited film properties during initial deposition stages, and variation in gap-fill from wafer to wafer.

In the example shown in FIG. 3, the LFM does not provide a stable TEOS flow for about the first 30 seconds. Specifically, a set point of 5% of the full TEOS range is given to the TEOS LFM at t=0 seconds. However, the particular TEOS LFM shown in FIG. 3 exhibits a lag of about 10 seconds as it continues to read zero. Moreover, between 10 seconds and about 25 seconds into the TEOS flow, the percentage of TEOS in the process gas flow increases unevenly to reach about 5%. Different individual LFMs exhibit slightly different behavior, such that the precise initial TEOS flow profile cannot be anticipated and compensated for with other process parameters. Therefore, stabilizing the TEOS flow prior to initiating the deposition process in accordance with certain embodiments of the present invention may improve consistency of oxide deposited from wafer to wafer.

In order to overcome the intrinsic limitation of uncontrollable TEOS flows at low TEOS flow rates, embodiments in accordance with the present invention may allow the gas to stabilize at a small, non-zero flow prior to elevation to the desired set point. This pre-deposition flow stabilization phase is shown as A' in FIG. 3. TEOS flowed during this pre-deposition stabilization phase A' is shunted directly to the chamber exhaust, by-passing the deposition chamber entirely. While the process may be used to deposit silicon oxide films, it may also beneficially be applied to single-or multiple-layer doped silicon glass films, such as borophosphosilicate glass ("BPSG"), phosphosilicate glass ("PSG"), borosilicate glass ("BSG"), arsenic-silicon glass ("AsSG"), or similar films.

In the pre-deposition phase A' of the process shown in FIG. 3, the percentage of TEOS present in the flowed process gas is maintained at a 5% of the full range for about 35 seconds. Once the TEOS gas flow has stabilized at 5%, at 60 seconds into the TEOS flow the TEOS is allowed to enter the processing chamber and be exposed to ozone, thereby commencing initial deposition stage A of the oxide CVD step. During this initial deposition stage A, oxide formed over the substrate exhibits a high degree of conformality, but is deposited at relatively low rates.

As described in detail below, the relative concentration of the TEOS or other silicon-containing gas in the process gas flowed to the chamber will vary over the course of the deposition step. However, an oxide CVD step in accordance with the present invention is characterized in that once the silicon-containing gas is introduced into the chamber, it continues to flow into the chamber for the duration of the oxide CVD step.

Beginning with the first deposition stage A of the process shown in FIG. 3, the percentage of TEOS in the flowed process gas is steadily increased. For example, in the specific embodiment shown in FIG. 3, 60 seconds into the initial deposition phase A (and 120 seconds from the initial flowing of the TEOS), the percentage of TEOS has increased to 30% of the full range from the initial setpoint of 5%.

Figure 11:
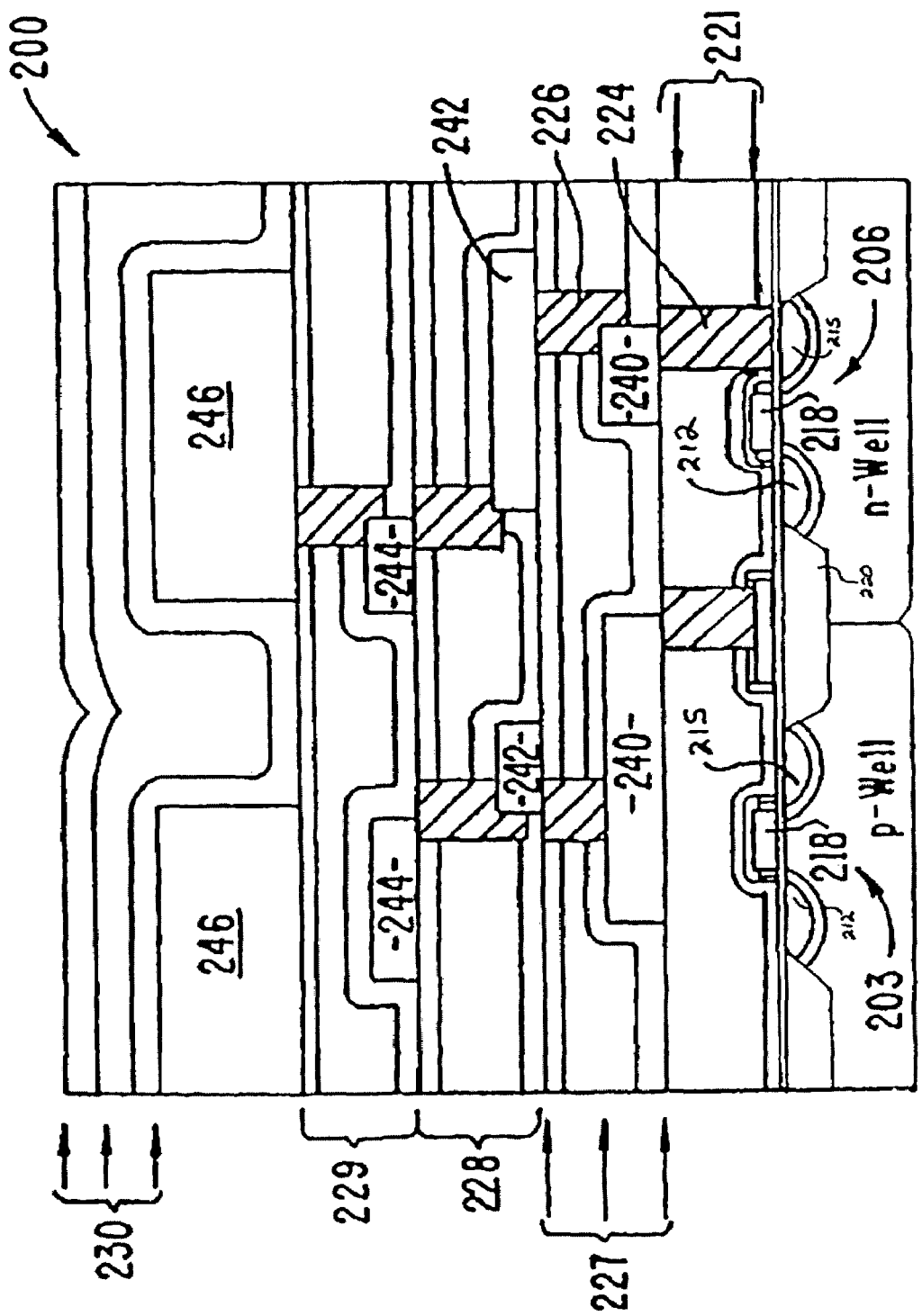
FIG. 11 is a simplified cross section of a portion of an integrated circuit according to the present invention.

FIG. 11 plots percentage of TEOS in the total process gas flowed versus time, for the entire deposition process step whose initial stage is shown in FIG. 3. After about 180 seconds from the point that the TEOS was initially flowed, in stage B the change in TEOS:$O_3$ flow ratio is halted to produce a flow of a processing gas mixture having an unchanging composition of about 60% of the full range of TEOS. Conditions during interim deposition stage B permit formation of additional volumes of oxide material at high rates, for example as may be useful to fill the volume of a larger-sized trench.

After about 300 seconds from the point that TEOS was originally flowed, in stage C the TEOS:$O_3$ flow ratio is again steadily increased to provide deposition of additional silicon oxide material at even higher rates. Such additional deposition may again be useful to fill large volumes of space between features, or to create a bulk layer of oxide overlying the filled features (see description of FIG. 10 below).

Figure 4:
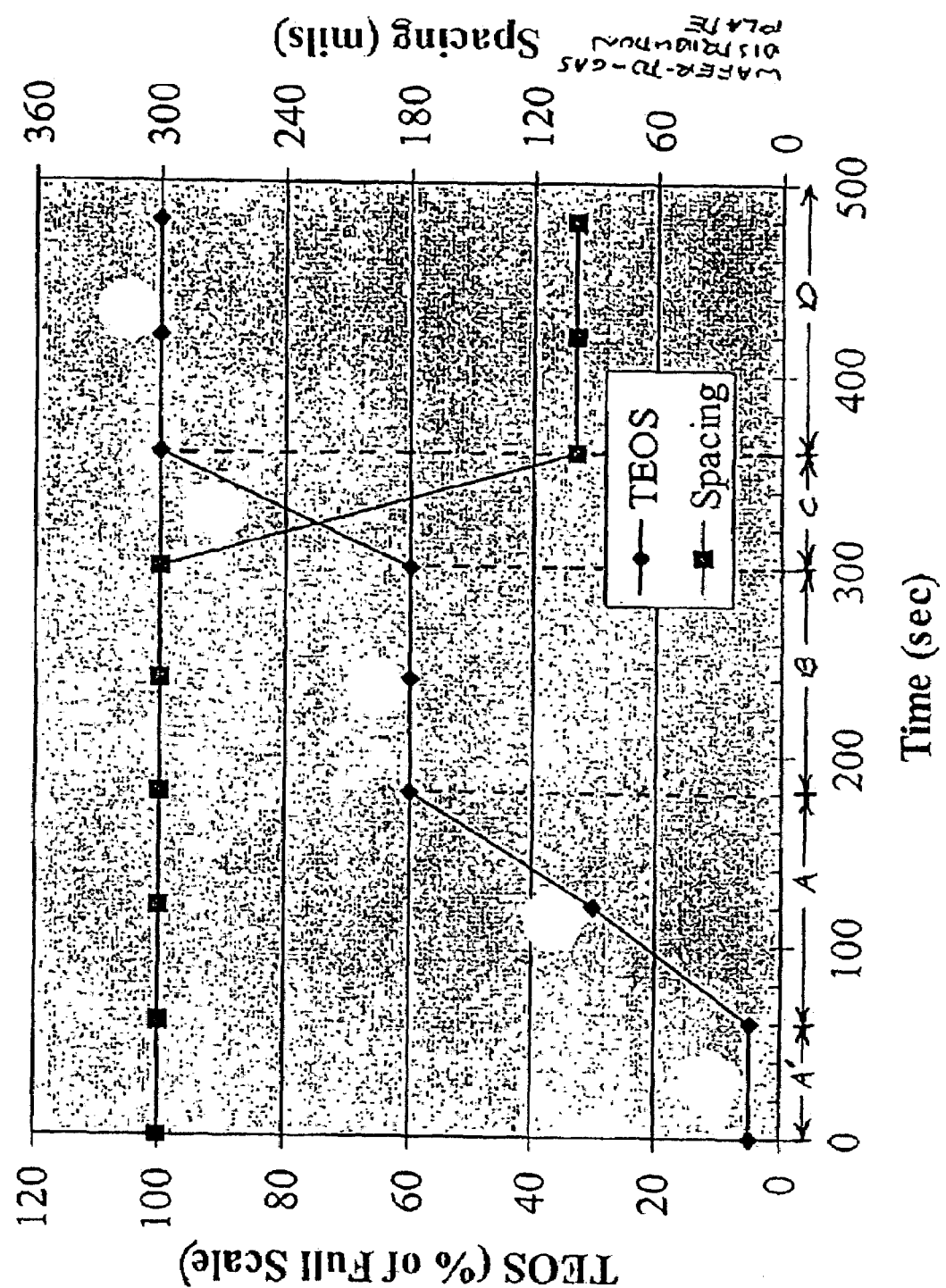
FIG. 4 plots the percentage composition of TEOS in the processing gas mixture flowed during all phases of the embodiment shown in FIG. 3.

In addition to the first vertical axis labeled % TEOS, FIG. 4 also includes a second vertical axis labeled "wafer-to-gas distribution plate spacing." The gas distribution plate of an apparatus is positioned over a substrate heater which is moveable in a vertical direction. The rate of deposition of silicon oxide and other materials increases as spacing between the wafer surface and gas distribution showerhead is reduced. Conversely, at larger spacing between the wafer surface and the gas distribution plate the rate of deposition is reduced but the conformal characteristics of the deposited film is improved.

Accordingly, FIG. 4 shows that during stage C of the oxide CVD process step, spacing between the wafer and the gas distribution plate is steadily reduced from 300 mils to about 100 mils. This decreased spacing further enhances the rate of deposition of the oxide material during this stage C of the deposition step.

In final stage D of the process illustrated in FIGS. 3 and 4, after 360 sec. from the original time of flowing of the TEOS, the TEOS:ozone ratio is stabilized at 100% of the maximum TEOS concentration utilized during the entire deposition process, resulting in deposition of oxide films at a maximum rate. Such rapid deposition with relatively low conformality may be desirable, for example, where the oxide is being deposited as a bulk layer overlying an oxide filled feature Such a bulk oxide layer may serve as a useful starting point for subsequent processing, for example a chemical mechanical polishing (CMP) process.

Embodiments in accordance with the present invention offer a number of advantages over deposition of silicon oxide utilizing conventional approaches. One advantage is high conformality and favorable step coverage and gap-fill, while maintaining a high throughput.

Specifically, conventional processes allow for a flow of processing gas comprising an unvarying concentration of TEOS for a set duration. Under such conditions, a low TEOS: ozone ratio provides deposition conditions optimal for gap-fill and film conformity. However, the rate of oxide deposition is low, adversely affecting process throughput.

One possible compromise is a conventional two-step process described briefly above, wherein a first step is performed under process conditions with a low TEOS:ozone ratio and low deposition rate for achieving the desired gap-fill. The flow of silicon-containing gas to the chamber is interrupted, and then a second distinct step is performed under different conditions with a high TEOS:ozone ratio and a high deposition rate for bulk fill. However, such a two-step process may exhibit reduced throughput due to the extended time required in the first step, and also the time consumed in halting the flow of process gas to the chamber and changing the apparatus configuration between the first and second steps. By contrast, embodiments in accordance with the present invention accomplish deposition of conformal oxide layers with acceptable throughput by increasing the amount of TEOS in a controlled manner over the course of the unitary deposition step.

While the above is a complete description of specific embodiments of the present invention, various modifications, variations, and alternatives may be employed. For example, while the embodiment of a process in accordance with the present invention shown and described in conjunction with FIGS. 3 and 4 includes a pre-deposition gas flow stabilization phase A' during which the flow of gas is diverted from the processing chamber, this is not necessarily required by the present invention. Alternative embodiments of process recipes in accordance with the present invention could call for flowing the silicon-containing component of the process gas flow at a sufficiently high initial concentration to allow the process gases to be introduced directly into the chamber, without an initial flow diversion phase.

Moreover, other techniques for varying the parameters of deposition of an oxide layer could be employed in conjunction with the variation in concentration of the process gas flow components described so far. One example of a process parameter that can be varied is the wafer-to-gas distribution plate spacing described and illustrated in conjunction with FIG. 4. Examples of other possible parameters to be varied include but are not limited to the temperature of deposition, the pressure of deposition, and the flow rate of processing gases containing dopants such as As, B, and P.

The specific process illustrated in FIGS. 3 and 4 represents only one example of a particular deposition process in accordance with the present invention, and specific parameters of the process could be varied to accomplish the results desired for a particular application.

Thus while FIGS. 3 and 4 show a variation over time in the concentration of vaporized TEOS relative to ozone, the present invention is not limited to this particular combination of process gases, and alternative embodiments in accordance with the present invention could utilize other process gases. For example, a list of silicon-containing processing gases potentially useful in conjunction with the present invention includes but is not limited to silane, trimethylsilane, tetramethylsilane, dimethylsilane, diethylsilane, octamethyl-trisiloxane (OMTS), and tetramethylcyclotetrasiloxane (TOMCATS). Examples of other possible oxidizing processing gases useful in conjunction with the present invention include but are not limited to oxygen, steam, and nitrogen dioxide ($NO_2$).

And while FIGS. 3 and 4 illustrate a deposition process step wherein the percentage contribution of silicon-containing process gas in the overall process gas flow is increased over time, this is not required by the present invention. In alternative embodiments, the percentage contribution of silicon-containing process gas in the overall process flow may be reduced, reduced and then increased, or increased and then reduced, over the course of a single deposition step.

Moreover, while FIG. 4 shows a deposition process step wherein the concentration of a silicon-containing component of a processing gas flow is increased in a linear fashion over two stages separated by a stage of constant concentration, embodiments in accordance with the present invention are not limited to this particular concentration variation profile. Alternative embodiments in accordance with the present invention could exhibit a wide variety of changing, non-linear composition profiles.

Changes in composition of process gases flowed during deposition of silicon oxide in accordance with the present invention may be accomplished in a variety of ways. In the process shown in FIGS. 3 and 4, for example, only the relative percentage of TEOS in the overall process gas flow is shown as increasing. Such an increase could be produced by elevating the flow rate of the silicon-containing gas, reducing the flow rate of the oxidizing component of the process gas, or any combination of a change in flow rates of the components of the processing gas mixture which results in a change in the overall percentage composition of the silicon-containing gas.

Moreover, a change in the relative ratio of components of the processing gas mixture may be accomplished by other than changing the flow rates of the components. For example, ozone is frequently formed by flowing oxygen through an ozone generator, resulting in a gas flow comprising oxygen and some percentage of ozone. Changes in the concentration of silicon-containing gas relative to ozone could also be accomplished by altering the conditions of generation of the ozone to increase its concentration, without altering the flow rate of the ozone into the processing chamber.

Figure 5A:
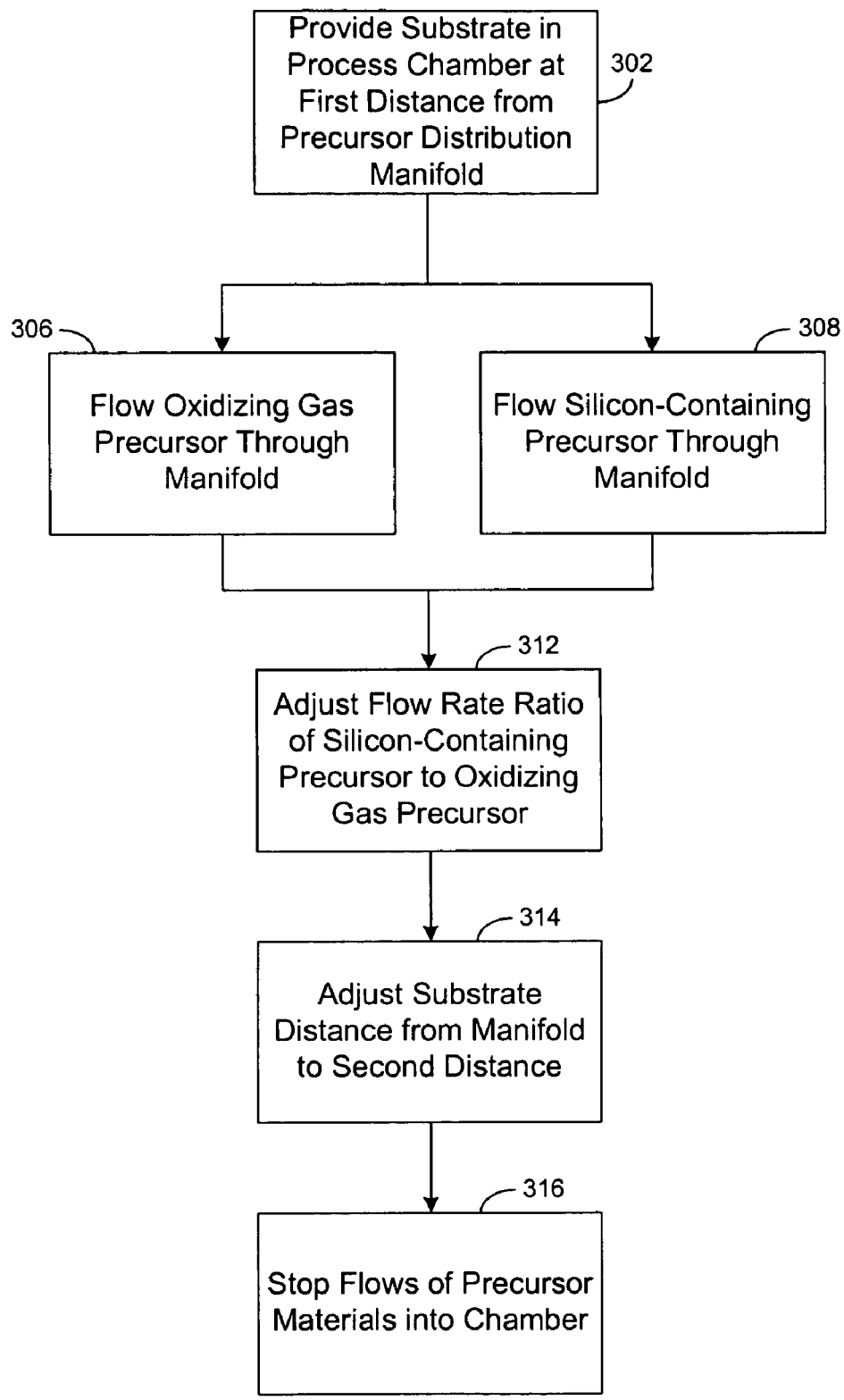
FIGS. 5A-C are flowcharts illustrating steps that may be included in processes of forming a dielectric layer on a substrate according to embodiments of the invention.

FIG. 5A is a flowchart that illustrates steps that may be included in a process of forming a dielectric layer on a substrate according to embodiments of the invention. These embodiments include using HARP techniques for varying the deposition rate of the dielectric materials during the formation of the dielectric layer. The process includes providing a substrate in a process chamber at a first distance from the gas distribution manifold (e.g., showerhead) in step 302. The gas distribution manifold may include separate inlets for the precursor materials, or a single inlet through which mixtures of the precursors enter the process chamber.

After the substrate is placed in the process chamber, the precursor materials may flow through the manifold. This may include flowing an oxidizing gas precursor 306 (e.g., $O_2$, $O_3$, NO, $NO_2$, mixtures thereof, etc.), a silicon-containing precursor 308 (e.g., silane, dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), mixtures thereof, etc.) through the manifold. Each precursor flows through the manifold and into the process chamber at an initial flow rate. For example, the silicon-containing precursor may initially flow through the manifold at about 20 to about 100 sccm, while the oxidizing precursor flows at about 60 to about 1000 sccm.

Depending on the type of CVD process used, the precursor materials may first help form a plasma whose products are used to form the dielectric layer on the substrate. Embodiments of the invention may be used with plasma CVD techniques such as plasma enhanced CVD (PECVD), and high density plasma CVD (HDPCVD), as well as thermal CVD techniques such as atmospheric pressure CVD (APCVD), sub-atmospheric CVD (SACVD), and low-pressure CVD (LPCVD), among others.

The initial flow rates of the precursors establish first flow rate ratios for the silicon-containing precursor:oxidizing gas precursor. When the initial deposition of dielectric materials includes trench fills, the ratio of silicon-containing precursor:oxidizing gas precursor may be relatively low to provide a slower deposition of dielectric materials in the trenches. As the deposition progresses, the ratio of silicon-containing precursor:oxidizing gas precursor may be adjusted in step 312. For example, once a portion of the trenches has been filled, the ratio of silicon-containing precursor:oxidizing gas precursor may be increased to increase the deposition rate of the dielectric material. The adjustment is made at a stage of the deposition when there is reduced risk of the higher deposition rate causing voids or weak seams in the trenches.

Moreover, a change in the relative ratio of components of the processing gas mixture may be accomplished by other than changing the flow rates of the components. For example, when ozone is used as the oxidizing gas precursor, it's frequently formed by flowing oxygen through an ozone generator, resulting in a gas flow comprising oxygen and some percentage of ozone. Changes in the concentration of silicon-containing precursor relative to ozone (i.e., the oxidizing gas precursor) could also be accomplished by altering the conditions of generation of the ozone to increase its concentration, without altering the flow rate of the ozone into the processing chamber.

The deposition rate of the dielectric layer may also be changed by adjusting the distance between the substrate and manifold to a second distance 314. The process chamber may include an adjustable lift that can vary the space between the substrate and the manifold during the deposition. As the substrate moves closer to the manifold, it enters a zone where the precursor materials are more concentrated, and form the dielectric layer at a faster rate. Thus, when the dielectric materials can be deposited on the substrate at a higher deposition rate without causing voids or weak seams, the substrate may be moved from an initial first distance to a second distance that is closer to the process chamber manifold.

At the completion of the deposition of the dielectric layer, the precursor materials stop flowing into the chamber 316. Additional process steps (e.g., annealing, chemical-mechanical polishing, etc.) may follow the dielectric deposition, before the substrate is removed from the process chamber.

Figure 5B:
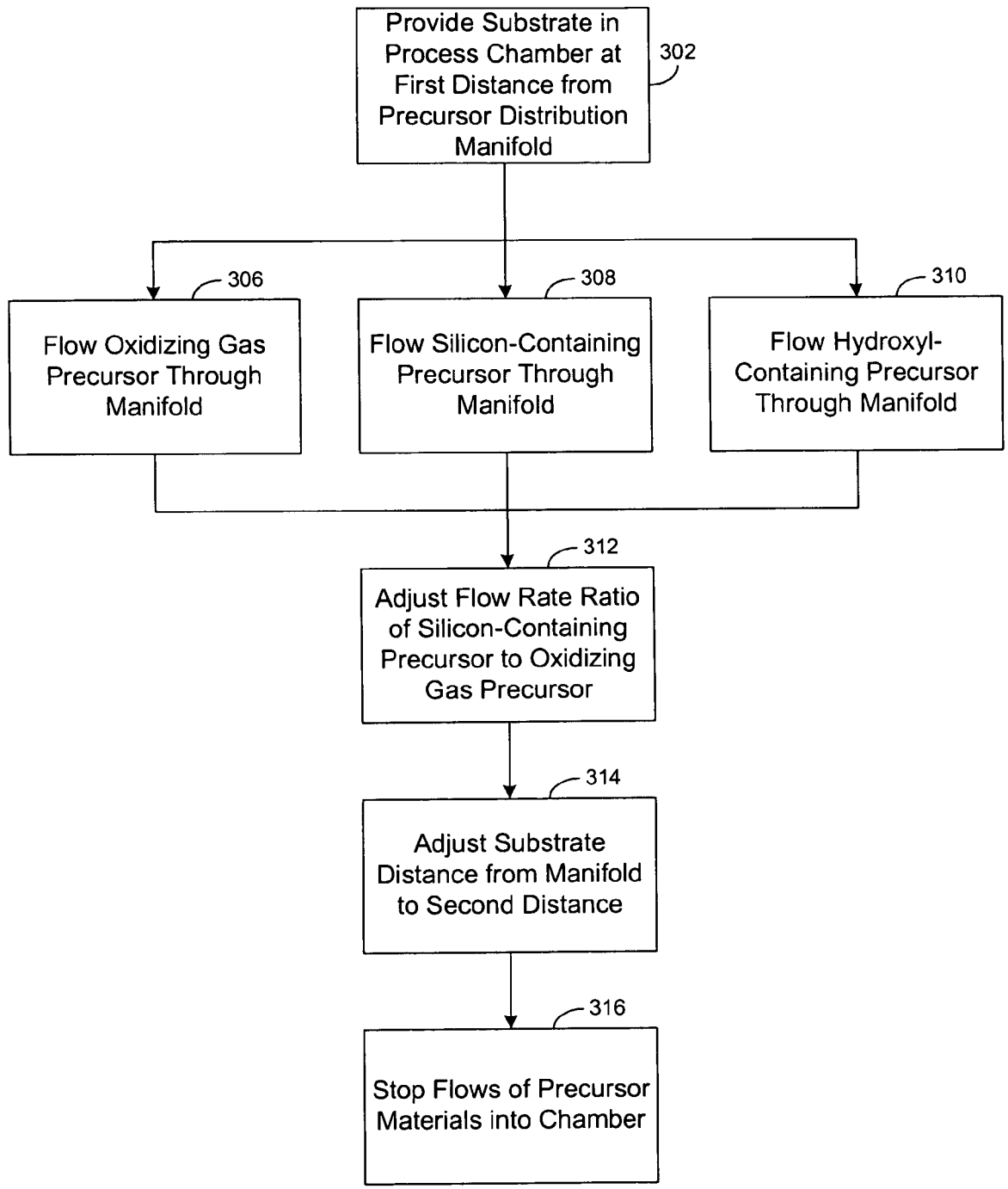

FIG. 5B is a flowchart that illustrates steps that may be included in a process of forming a dielectric layer on a substrate according to additional embodiments of the invention. These embodiments include using HARP techniques for varying the deposition rate of the dielectric materials during the formation of the dielectric layer, and the introduction of a hydroxyl-containing precursor during the process. The process includes providing a substrate in a process chamber at a first distance from the gas distribution manifold (e.g., showerhead) in step 302. The gas distribution manifold may include separate inlets for the precursor materials, or a single inlet through which mixtures of the precursors enter the process chamber.

After the substrate is placed in the process chamber, the precursor materials may flow through the manifold. This may include flowing an oxidizing gas precursor 306 (e.g., $O_2$, $O_3$, NO, $NO_2$, mixtures thereof, etc.), a silicon-containing precursor 308 (e.g., silane, dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), mixtures thereof, etc.), and a hydroxyl-containing precursor 310 (e.g., $H_2O$, $H_2O_2$, etc.) through the manifold. Each precursor flows through the manifold and into the process chamber at an initial flow rate. For example, the silicon-containing precursor may initially flow through the manifold at about 20 to about 100 sccm, while the oxidizing precursor flows at about 60 to about 1000 sccm, and the hydroxyl-containing precursor flow at about 60 to about 200 sccm.

The initial flow rates of the precursors establish first flow rate ratios for the silicon-containing precursor:oxidizing gas precursor, and the silicon-containing precursor:hydroxyl-containing precursor. When the initial deposition of dielectric materials includes trench fills, the ratio of silicon-containing precursor:oxidizing gas precursor may be relatively low to provide a slower deposition of dielectric materials in the trenches. As the deposition progresses, the ratio of silicon-containing precursor:oxidizing gas precursor may be adjusted in step 312. For example, once a portion of the trenches has been filled, the ratio of silicon-containing precursor:oxidizing gas precursor may be increased to increase the deposition rate of the dielectric material. The adjustment is made at a stage of the deposition when there is reduced risk of the higher deposition rate causing voids or weak seams in the trenches.

The flow rate ratio of the silicon-containing precursor to the hydroxyl-containing precursor may also be relatively low in the initial deposition stage. When the flow rate ratio of silicon-containing precursor:oxidizing gas precursor is increased, the ratio of silicon-containing precursor:hydroxyl-containing precursor may increase as well. Alernatively, the ratio of silicon-containing precursor:hydroxyl-containing precursor may remain substantially constant as the ratio of silicon-containing precursor:oxidizing gas varies, such as embodiments where the silicon-containing and hydroxyl-containing precursors flow together into the process chamber.

Figure 6A:
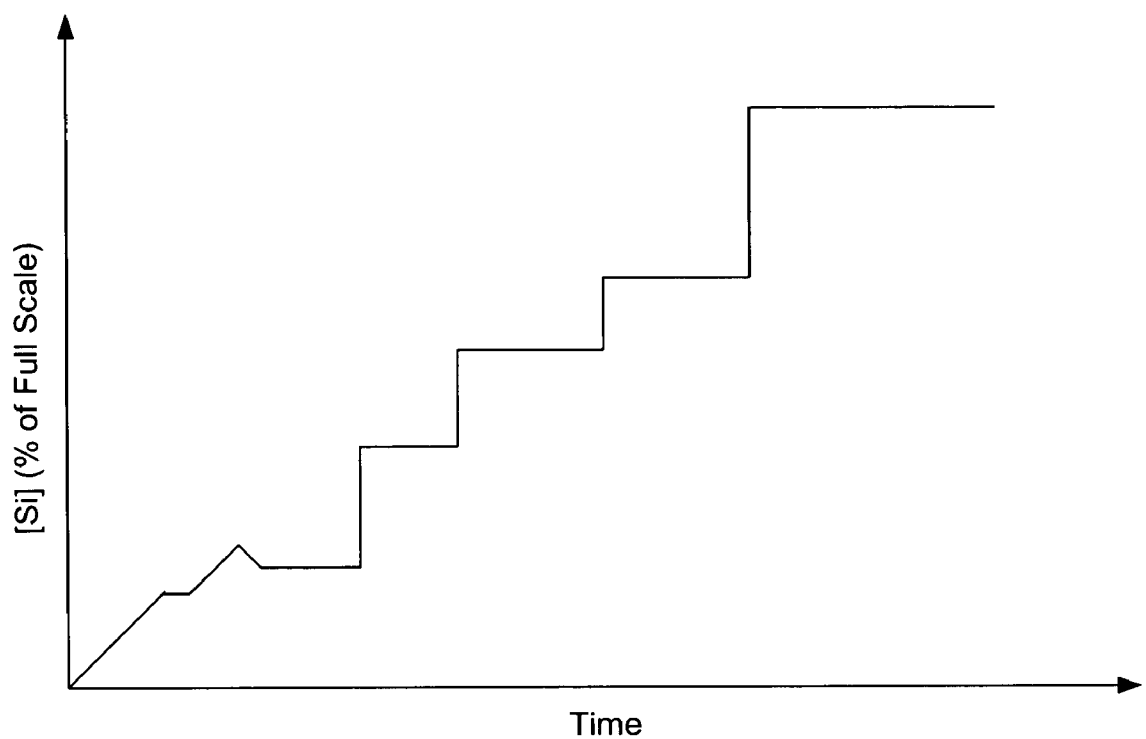
FIGS. 6A-B are simplified graphs plotting the relative concentration of a silicon-containing components over time according to embodiments of the invention.
Figure 6B:
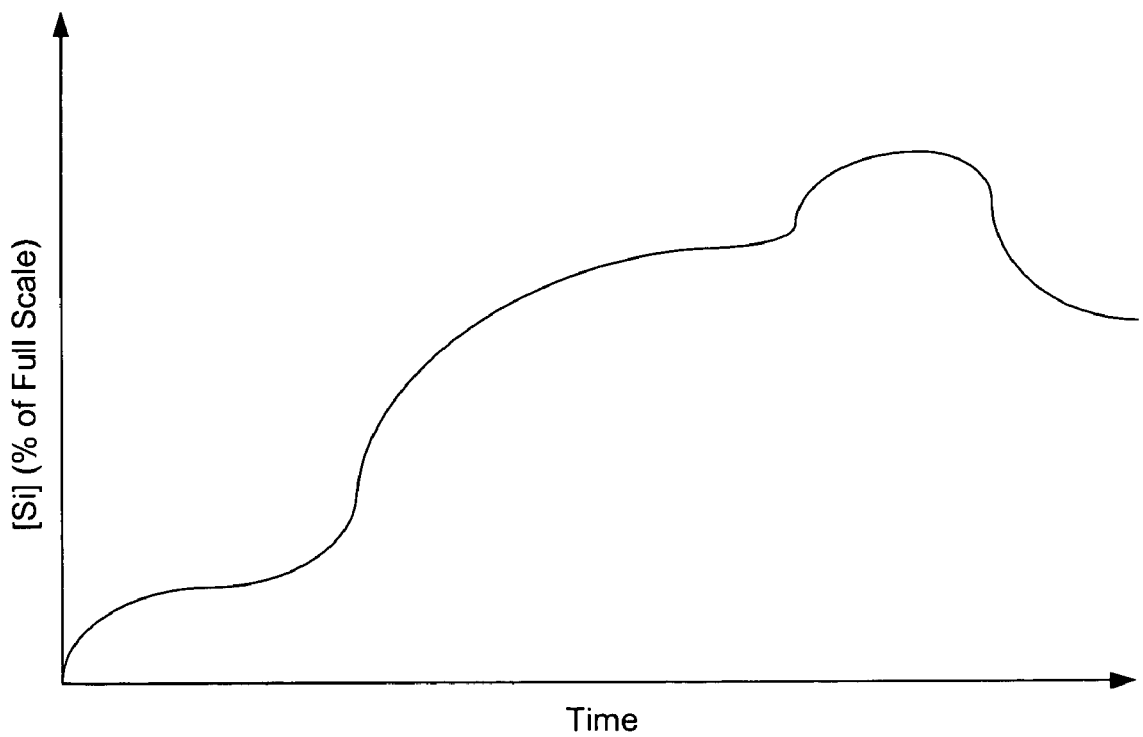

FIG. 6A is a simplified graph plotting the concentration of a silicon-containing gas component relative to a process maximum, versus time, in an embodiment of a deposition process in accordance with the present invention featuring a stepped deposition rate profile. Alternative embodiments in accordance with the present invention could exhibit a wide variety of changing, non-linear composition profiles. FIG. 6B is a simplified graph plotting the concentration of a silicon-containing gas component relative to a process maximum, versus time, for another alternative embodiment of a deposition process in accordance with the present invention featuring a nonlinear profile.

Changes in composition of process gases flowed during the dielectric deposition may be accomplished in a variety of ways. Embodiments of the method have an increasing relative percentage of the silicon-containing precursor to the overall precursor mixture flow. Such an increase could be produced by elevating the flow rate of the silicon-containing precursor, reducing the flow rate of the oxidizing gas precursor, reducing the flow rate of the hydroxyl-containing precursor, or any combination of a change in flow rates of the components of the processing gas mixture which results in a change in the overall percentage composition of the silicon-containing precursor.

Figure 5C:
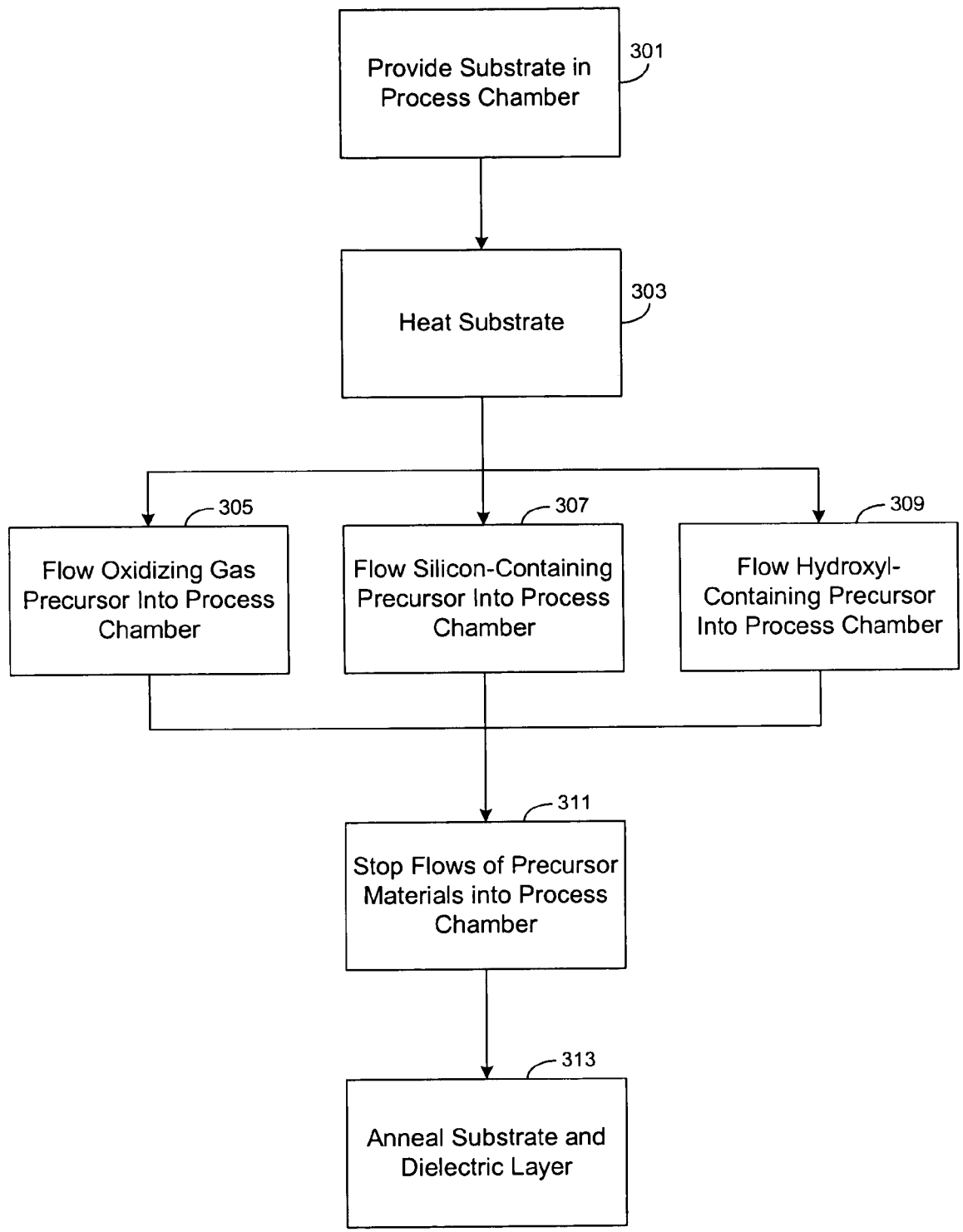

Referring now to FIG. 5C, a flowchart illustrating steps for forming a dielectric layer on a substrate according to additional embodiments of the invention is shown. The process includes providing a substrate in a process chamber in step 301. The substrate is then heated in step 303 to a temperature at which the dielectric layer is formed (e.g., about 400° C. or more, about 450° C. to about 750° C., about 500° C. to about 600° C., etc.). Heating the substrate facilitates the chemical vapor deposition of precursor materials into solid, but flowable dielectric layer having a wet etch rate ratio (WERR) of about 2.5 or less. When the substrate is not heated, or heated to lower temperatures (e.g., about 200° C. or less), the deposited dielectric normally has a spin-on liquid consistency and has to undergo subsequent heating and/or annealing that can increase overall deposition time.

Precursor materials are provided to the heated substrate by flowing oxidizing gas precursor, silicon-containing precursor, and hydroxyl-containing precursor to the process chamber in steps 305, 306 and 307. The precursors may be mixed together and flow through a single channel into the process chamber at a constant flow rate until the flows are stopped at the end of the deposition 311. Alternatively, the silicon-containing precursor may flow though a channel that is independent of the oxidizing gas precursor and/or hydroxyl-containing precursor, and the flow rates of the precursors may be independently varied over the course of the deposition. The timing of the precursor materials may also be varied such that, for example, the oxidizing gas precursor and/or hydroxyl-containing precursor may be introduced before the silicon-containing precursor, or alternatively, all three precursors being introduced at the same time.

The dielectric layer formed on the substrate may be annealed in step 313. The anneal may be performed in the process chamber, or the substrate may be transferred to a separate annealing chamber. Exemplary anneal processes that may be used with embodiments of the invention will now be described.

Exemplary Post-Deposition Anneal Processes

Following the formation of the dielectric material, a post-deposition anneal may optionally be performed. The dielectric material may be annealed in an atmosphere such as $N_2$, $N_2O$, NO or $NH_3$. In one embodiment, the annealing process includes heating the substrate and flowing $N_2O$ into the chamber or furnace. The $N_2O$ interacts with the silicon oxide material at high temperatures and strengthens any remaining weak seams. The annealed layer is substanitally seam-free and suited for further treatments such as CMP.

Annealing may take place in situ or ex situ. For example, the annealing may take place in the CVD chamber immediately after the depostion. Annealing alternatively may take place in another chamber of a multi-chamber system or in a different chamber system (e.g., a furnace). In some embodiments, annealing comprises a Rapid Thermal Process (RTP) as more fully described in U.S. Pat. No. 5,660,472, the entire disclosure of which is herein incorporated by reference for all purposes.

The annealing temperature may range from about 750° C. to about 1000° C. for furnace anneal and up to about 1200° C. for RTP anneal. The annealing duration is temperature dependent and may range from about 10 minutes to around 2 hours for furnace anneal and as few as 5 seconds up to around 3 minutes for RTP. As a result, in most cases, the layer is annealed by restructuring the $SiO_2$ network without exceeding the $SiO_2$ reflow temperature.

In other embodiments, the anneal process may include a multi-step anneal similar to those described in co-assigned U.S. Prov. Patent App. Ser. No. 60/598,939, titled "MULTI-STEP ANNEAL OF THIN FILMS FOR FILM DENSIFICATION AND IMPROVED GAP-FILL," filed Aug. 4, 2004, by Nitin K. Ingle et al., the entire contents of which is hereby incorporated by reference for all purposes.

EXAMPLES

In these examples, silicon oxide ($SiO_2$) dielectric materials were deposited in substrate trenches using TEOS as the silicon-containing precursor, ozone as the oxidizing gas precursor and water vapor as the hydroxyl-containing precursor. The depositions are performed in a process chamber configured for thermal CVD.

Figure 7A:
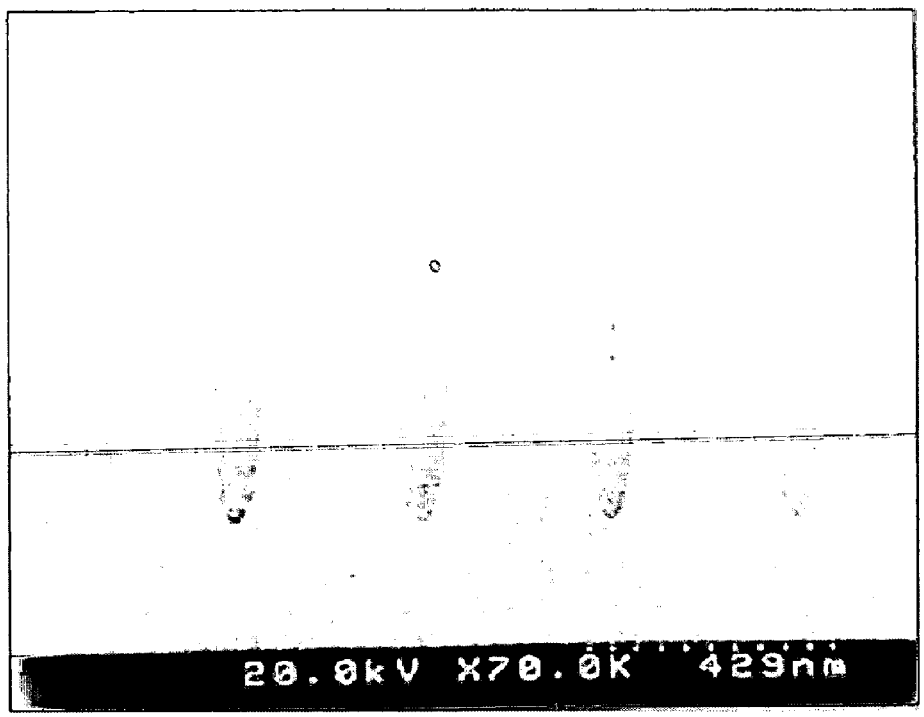
FIGS. 7A-B are a set of comparative electron micrographs of gap-filled trenches.
Figure 7B:
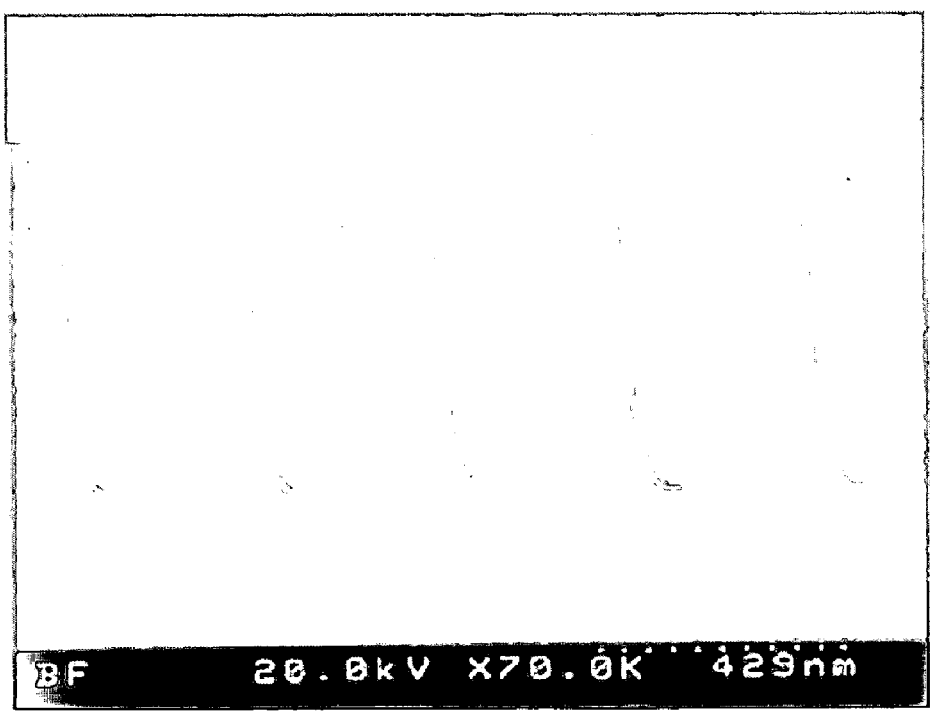

Silicon oxide gap-fills were performed according to embodiments of the methods of the invention and comparative examples using conventional gap-fill techniques were also run. FIGS. 7A-B show electron micrographs of trenches filled with silicon oxide dielectric materials. The trenches had a width of about 0.15 µm and an aspect ratio (height/width) of about 6:1. FIG. 7A shows an electron micrograph of trenches filled with a silicon oxide dielectric using a conventional gap-fill technique. The conventional technique included a thermal CVD deposition at 540° C. using TEOS as the silicon-containing precursor flowing at about 5000 milligrams per minute (mgm). No hydroxyl-containing precursor is introduced during the deposition. An anneal is performed following the deposition for 30 minutes at 1050° C. in a nitrogen ($N_2$) atmosphere. The spots in the middle of the filled trenches and blurred lines around the edges of the trench in FIG. 7A show extensive formation of voids and weak seams.

In comparison, FIG. 7B shows an electron micrograph of trenches filled with a silicon oxide dielectric according to an embodiment of the methods of the present invention. During the deposition, 2500 mgm of $H_2O$ was introduced with the TEOS. Other deposition conditions were substantially the same as for the conventional deposition described above for FIG. 7A. The micrograph in FIG. 7B lacks the spots and blurry trench edges indicative of the voids and weak seams seen in the gap-filled trenches of FIG. 7A.

Figure 8A:
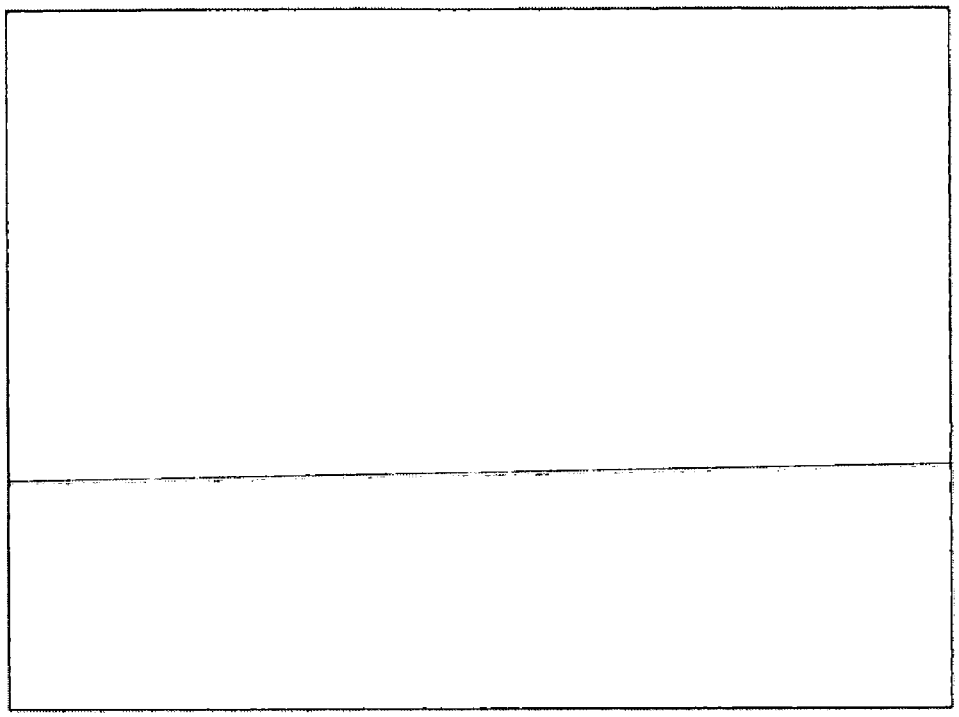
FIGS. 8A-B are another set of comparative electron micrographs of gap-filled trenches.
Figure 8B:
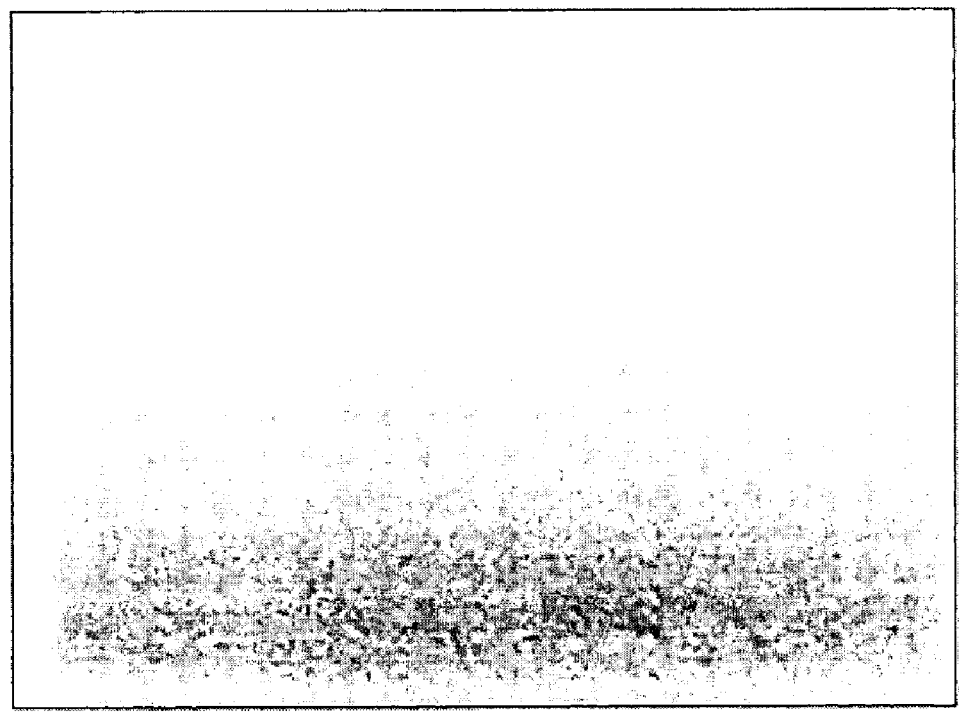

Referring now to FIGS. 8A-B another pair of electron micrographs of trenches filled with silicon oxide dielectric materials are shown. Similar to FIGS. 8A-B, the trenches had a width of about 0.15 µm and an aspect ratio (height/width) of about 6:1. FIG. 8A shows an electron micrograph of trenches filled with a silicon oxide dielectric using a conventional gap-fill technique. The conventional technique included a thermal CVD deposition at 540° C. using TEOS as the silicon-containing precursor flowing at about 5000 milligrams per minute (mgm). The elongated spots in the middle of the filled trenches in FIG. 8A show extensive formation of voids.

In comparison, FIG. 8B shows an electron micrograph of trenches filled with a silicon oxide dielectric according to an embodiment of the methods of the present invention. During the deposition, 10 grams/minute of $H_2O$ was introduced with the TEOS. Other deposition conditions were substantially the same as for the conventional deposition described above for FIG. 8A. The micrograph in FIG. 8B does not show any evidence of the elongated spots seen in FIG. 8A.

Figure 9:
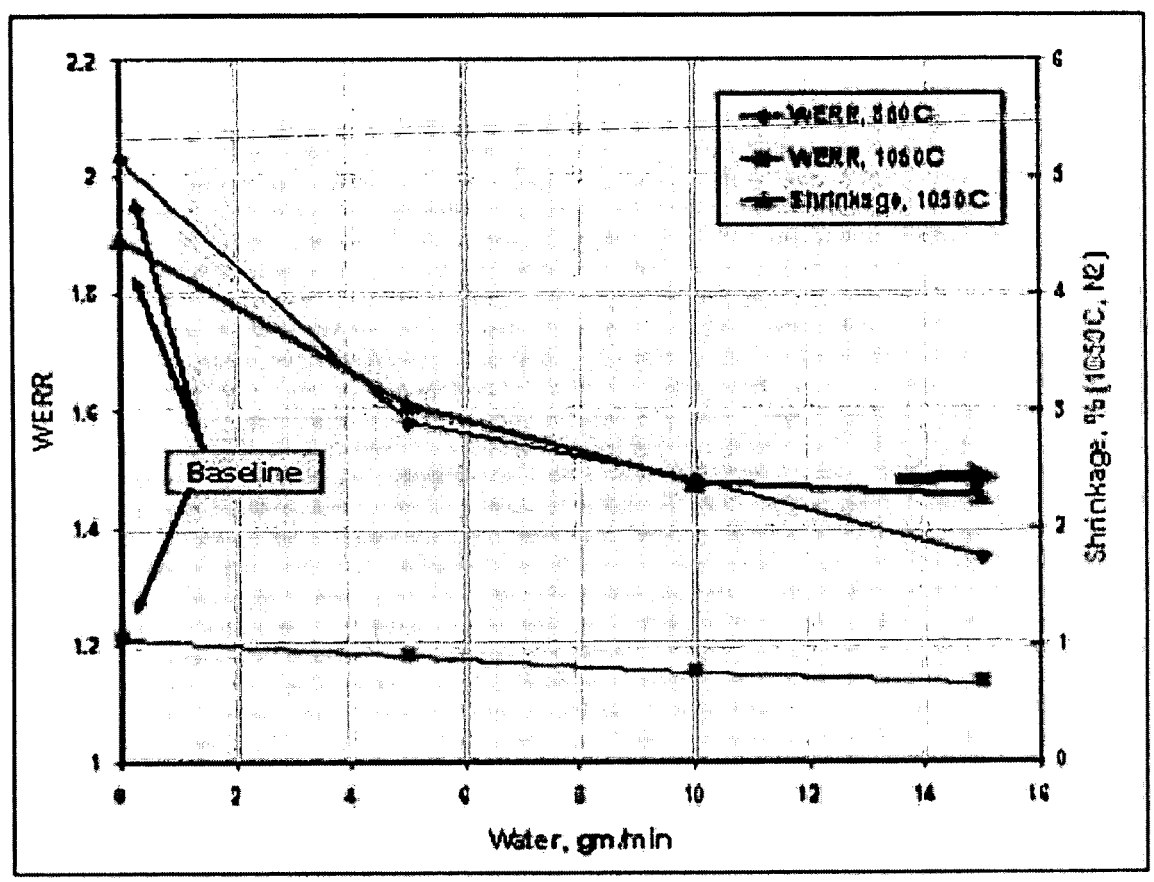
FIG. 9 is a graph of dielectric film properties versus the flow rate of water vapor during the deposition of the dielectric film.

FIG. 9 shows a graph of the wet etch rate ratio (WERR) and percent shrinkage of the silicon oxide films as a function of water vapor flow rate (in grams/minute) during film deposition. The graph shows that the WERR decreases with increasing water vapor flow rate for depositions at both 850° C. and 1050° C. Also, the graph shows for the 850° C. deposition that there is a smaller % shrinkage following a post-deposition anneal as the water vapor flow rate increases. The drop in % shrinkage is particularly notable when going from a moisture-free deposition (i.e., 0 gm/min $H_2O$) to a deposition that includes some water vapor (i.e., 5 gm/min $H_2O$).

Exemplary Semiconductor Structure

Figure 10:
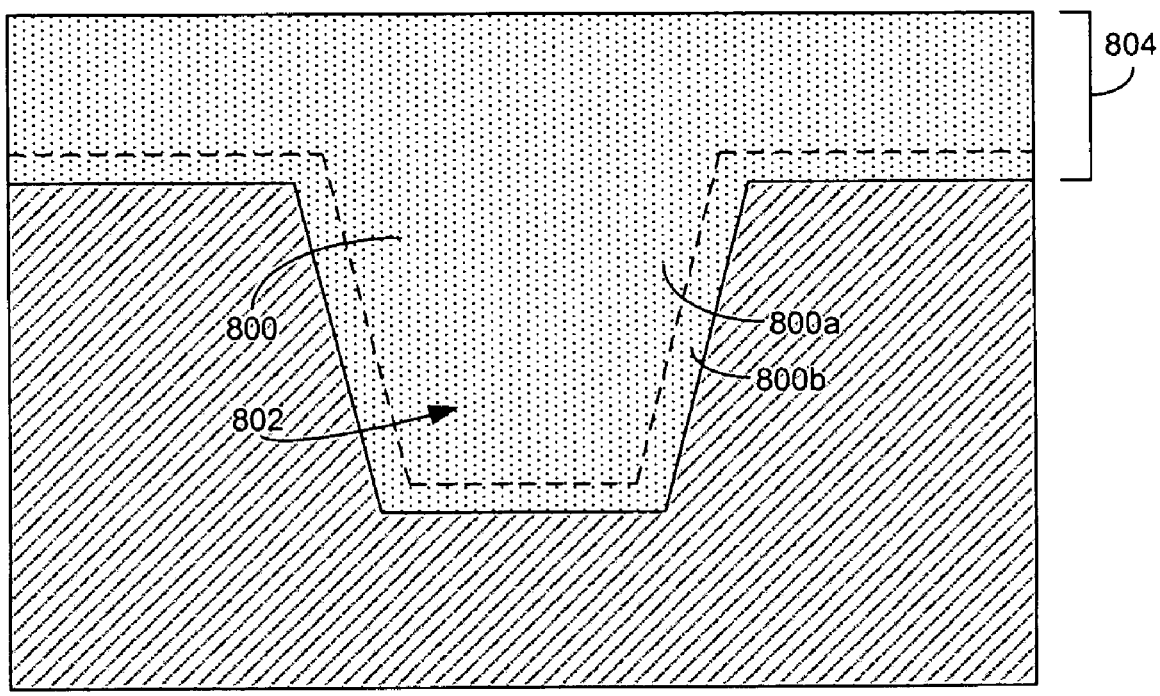
FIG. 10 shows a simplified cross-sectional view of an oxide-filled trench in accordance with an embodiment of the present invention.

FIG. 10 shows a simplified cross-sectional view of an oxide-filled trench structure formed utilizing an embodiment of a process in accordance with the present invention. Specifically, the time-varied flow rate ratio of silicon-containing precursor:oxidizing gas precursor during the deposition process results in formation of an oxide film 800 that includes a highly conformal portion 800a proximate to the surrounding silicon sidewalls, but which also includes a less-conformal body portion 800b which fills the entire volume of the trench 802 and creates overlying bulk layer 804 in a reasonable period of time. The oxide-filled trench 802 of FIG. 10 does not include the voids or weak seams associated with similar features formed utilizing the conventional oxide CVD processes previously described.

Trenches like the ones shown in FIG. 10 may be used in shallow trench isolation structures like those shown in FIG. 11, which illustrates simplified cross-section of an integrated circuit 200 according to embodiments of the invention. As shown in FIG. 11, the integrated circuit 200 includes NMOS and PMOS transistors 203 and 206, which are separated and electrically isolated from each other by oxide-filled trench isolation structure 220. Alternatively, field oxide isolation can be used to isolate devices, or a combination of isolation techniques may be used. Each of the transistors 203 and 206 comprises a source region 212, a gate region 215, and a drain region 218.

A premetal dielectric (PMD) layer 221 separates the transistors 203 and 206 from the metal layer 240, with connections between metal layer 240 and the transistors made by contacts 224. The premetal dielectric layer 221 may comprise a single layer or multiple layers. The metal layer 240 is one of four metal layers, 240, 242, 244, and 246, included in the integrated circuit 200. Each metal layer is separated from adjacent metal layers by intermetal dielectric layers 227, 228, and 229. Adjacent metal layers are connected at selected openings by vias 226. Planarized passivation layers 230 are deposited over the metal layer 246.

A silicon oxide layer according to the present invention may be used to form one or more of the dielectric layers shown in integrated circuit 200. For example, a silicon oxide layer deposited according to the present invention may be used to create trench isolation structure 220. A silicon oxide layer deposited according to the present invention may also be used to create PMD layer 221, or the higher layer intermetal dielectric layers 227-229 of the overlying interconnect structure.

A silicon oxide layer according to the present invention may also be used in damascene layers, which are included in some integrated circuits. In damascene layers, a blanket layer is deposited over a substrate, selectively etched through to the substrate, and then filled with metal and etched back or polished to form metal contacts 224. After the metal layer is deposited, a second blanket deposition is performed and selectively etched. The etched areas are then filled with metal and etched back or polished to form vias 226.

It should be understood that the simplified integrated circuit 200 is for illustrative purposes only. One of ordinary skill in the art could implement the present method for fabrication of other integrated circuits, such as microprocessors, application-specific integrated circuits (ASICs), memory devices, and the like.

Exemplary Deposition System

Figure 12A:
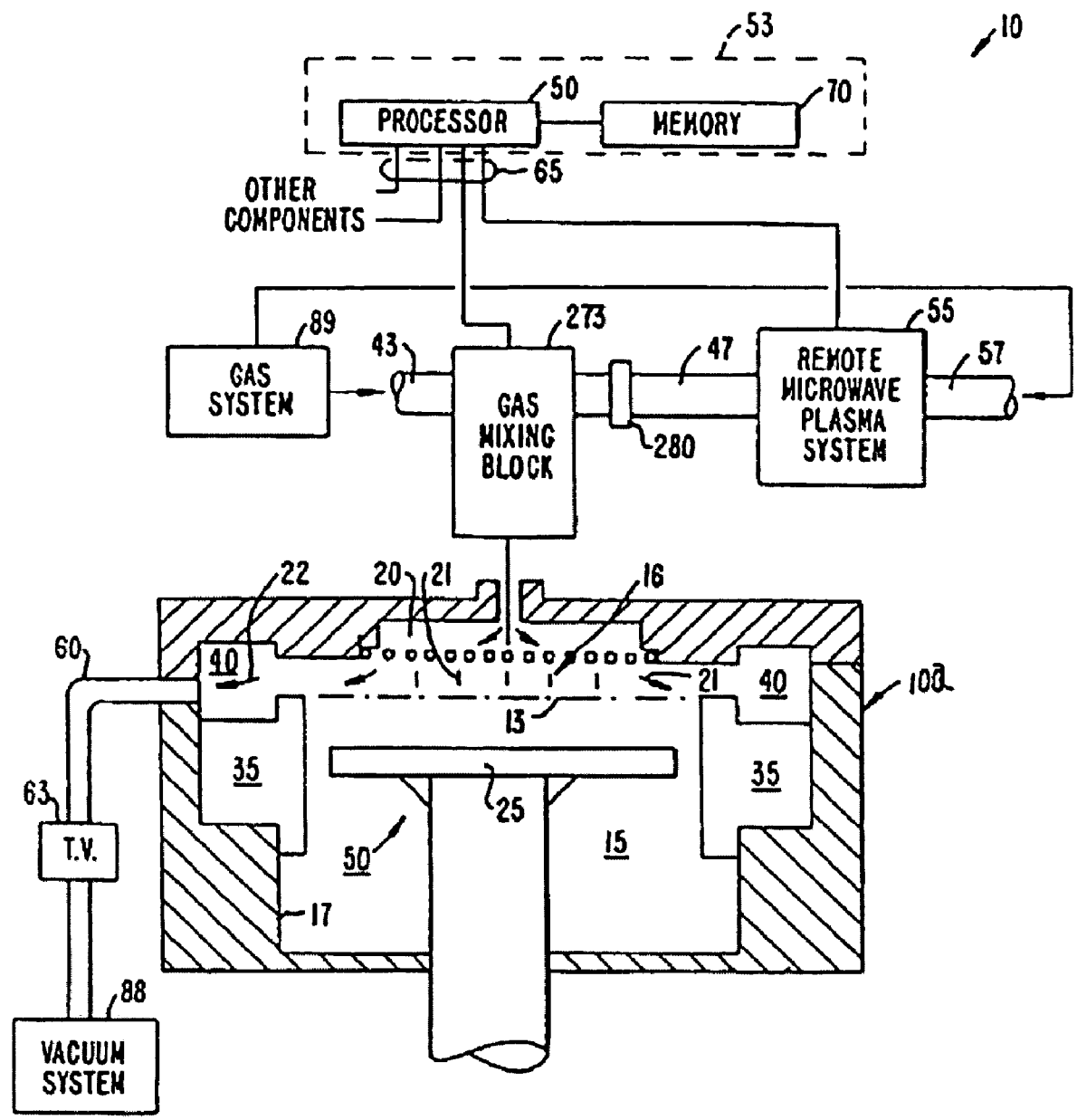
FIG. 12A is a simplified representation of a CVD apparatus according to the present invention.

FIG. 12A is a simplified diagram of a chemical vapor deposition ("CVD") system 10 according to embodiments of the invention. This system is suitable for performing thermal, sub-atmospheric CVD ("SACVD") processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 15 that receives process and other gases from a gas delivery system

89, a vacuum system 88, a remote microwave plasma system 55, and a control system 53. These and other components are described below in order to understand the present invention.

The CVD apparatus 10 includes an enclosure assembly 102 housing a vacuum chamber 15 with a gas reaction area 16. A gas distribution plate 20 is provided above the gas reaction area 16 for dispersing reactive gases and other gases, such as purge gases, through perforated holes in the gas distribution plate 20 to a wafer (not shown) that rests on a vertically movable heater 25 (also referred to as a wafer support pedestal). The heater 25 can be controllably moved between a lower position, where a wafer can be loaded or unloaded, for example, and a processing position closely adjacent to the gas distribution plate 20, indicated by a dashed line 13, or to other positions for other purposes, such as for an etch or cleaning process. A center board (not shown) includes sensors for providing information on the position of the wafer.

The heater 25 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 25 exposed to the vacuum chamber 15 are made of a ceramic material, such as aluminum oxide ($Al_2O_3$ or alumina) or aluminum nitride.

Reactive and carrier gases are supplied through the supply line 43 into a gas mixing box (also called a gas mixing block) 273, where they are preferably mixed together and delivered to the gas distribution plate 20. For example, silicon-containing precursor, such as silane, dimethylsilane, trimethylsilane, tetramethylsilane, diethylsilane, tetramethylorthosilicate (TMOS), tetraethylorthosilicate (TEOS), octamethyltetrasiloxane (OMTS), octamethylcyclotetrasiloxane (OMCTS), tetramethylcyclotetrasiloxane (TOMCATS), or mixtures thereof may be supplied to supply line 43 along with an oxide gas, such as oxygen ($O_2$), ozone ($O_3$), NO, $NO_2$, or mixtures thereof, and a hydroxyl-containing precursors such as $H_2O$, hydrogen peroxide, or mixtures thereof.

In alternate embodiments, the hydroxyl-containing precursor may be generated by combustion reactions that occur in (or near) vacuum chamber 15. For example, the hydroxyl-containing precursor may be in-situ generated steam (ISSG) that is generated by the combustion of hydrogen ($H_2$) and oxygen ($O_2$) in or near vacuum chamber 15 to form water vapor.

The gas mixing box 273 is preferably a dual input mixing block coupled to a process gas supply line 43 and to a cleaning/etch gas conduit 47. A valve 280 operates to admit or seal gas or plasma from the gas conduit 47 to the gas mixing block 273. The gas conduit 47 receives gases from an integral remote microwave plasma system 55, which has an inlet 57 for receiving input gases. During deposition processing, gas supplied to the plate 20 is vented toward the wafer surface (as indicated by arrows 21), where it may be uniformly distributed radially across the wafer surface, typically in a laminar flow.

Purging gas may be delivered into the vacuum chamber 15 from the plate 20 and/or an inlet port or tube (not shown) through the bottom wall of enclosure assembly 102. The purging gas flows upward from the inlet port past the heater 25 and to an annular pumping channel 40. An exhaust system then exhausts the gas (as indicated by arrows 22) into the annular pumping channel 40 and through an exhaust line 60 to a vacuum system 88, which includes a vacuum pump (not shown). Exhaust gases and entrained particles are drawn from the annular pumping channel 40 through the exhaust line 60 at a rate controlled by a throttle valve system 63.

In other embodiments (not shown) the silicon-containing precursors and the hydroxyl-containing precursors may travel through separate supply lines to a gas distribution plate in order to prevent them from reacting prematurely before reaching the substrate. As example of the dual channel supply line and showerhead design is described in co-assigned U.S. Pat. No. 6,624,091, titled "METHODS OF FORMING GAP FILL AND LAYERS FORMED THEREBY," filed May 7, 2001, the entire contents of which is hereby incorporated by this reference for all purposes.

The remote microwave plasma system 55 can produce a plasma for selected applications, such as chamber cleaning or etching native oxide or residue from a process wafer. Plasma species produced in the remote plasma system 55 from precursors supplied via the input line 57 are sent via the conduit 47 for dispersion through the plate 20 to the vacuum chamber 15. Precursor gases for a cleaning application may include fluorine, chlorine, and other reactive elements. The remote microwave plasma system 55 also may be adapted to deposit plasma-enhanced CVD films by selecting appropriate deposition precursor gases for use in the remote microwave plasma system 55.

The system controller 53 controls activities and operating parameters of the deposition system. The processor 50 executes system control software, such as a computer program stored in a memory 70 coupled to the processor 50. Preferably, the memory 70 may be a hard disk drive, but of course the memory 70 may be other kinds of memory, such as read-only memory or flash memory. In addition to a hard disk drive (e.g., memory 70), the CVD apparatus 10 in a preferred embodiment includes a floppy disk drive and a card rack (not shown).

The processor 50 operates according to system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 50 to configure the CVD system 10 into various apparatus.

The processor 50 has a card rack (not shown) that contains a single-board computer, analog and digital input/output boards, interface boards and stepper motor controller boards. Various parts of the CVD system 10 conform to the Versa Modular European (VME) standard which defines board, card cage, and connector dimensions and types. The VME standard also defines the bus structure having a 16-bit data bus and 24-bit address bus.

Figure 12B:
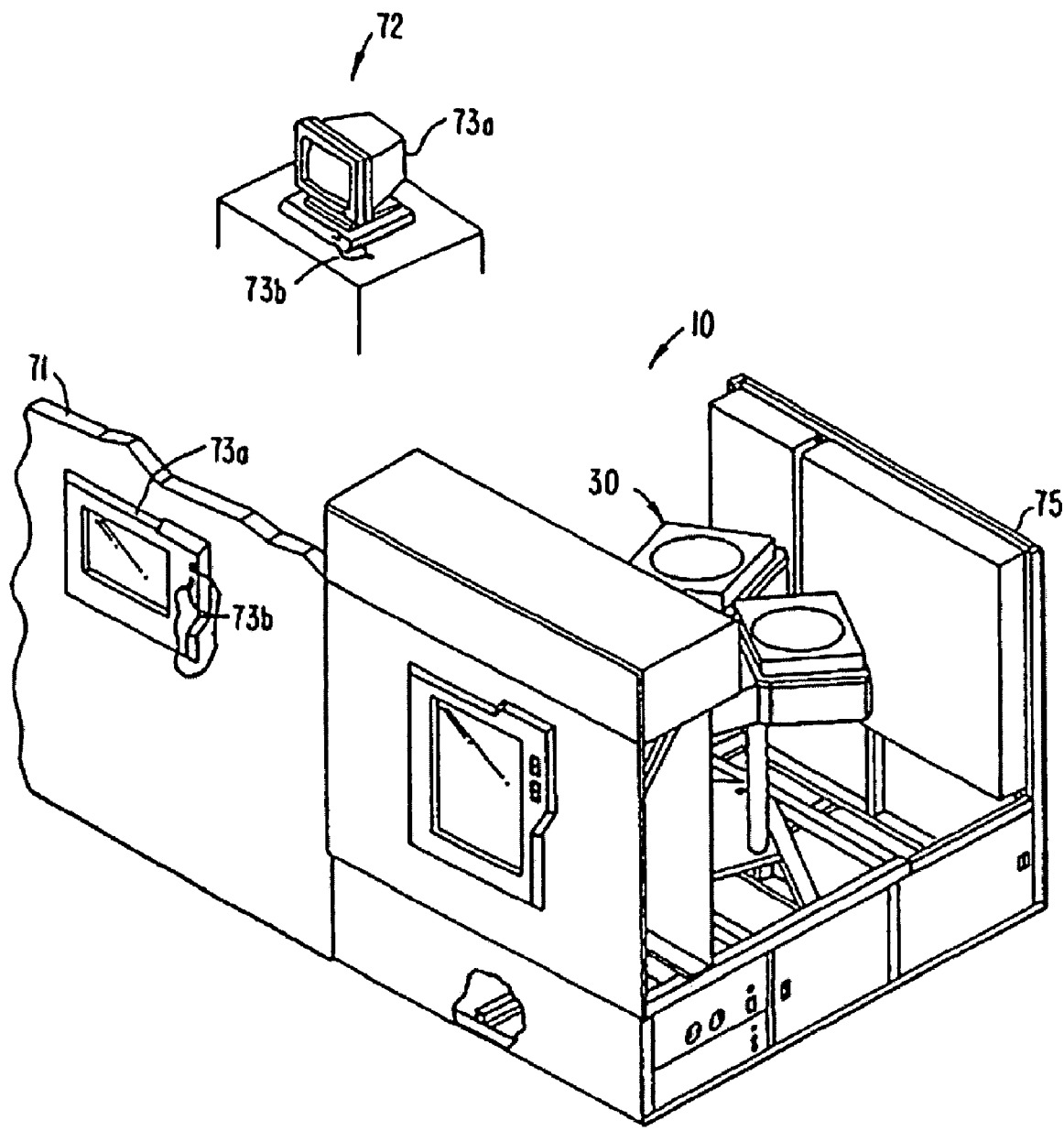
FIG. 12B is a simplified representation of the user interface for a CVD system in relation to a deposition chamber in a multi-chamber system.

FIG. 12B is a simplified diagram of a user interface in relation to the CVD apparatus chamber 30. The CVD apparatus 10 includes one chamber of a multichamber system. Wafers may be transferred from one chamber to another for additional processing. In some cases the wafers are transferred under vacuum or a selected gas. The interface between a user and the processor is via a CRT monitor 73*a* and a light pen 73*b*. A mainframe unit 75 provides electrical, plumbing, and other support functions for the CVD apparatus 10. Exemplary mainframe units compatible with the illustrative embodiment of the CVD apparatus are currently commercially available as the PRECISION 5000™, the CENTURA 5200™, and the PRODUCER SE™ systems from APPLIED MATERIALS, INC. of Santa Clara, Calif.

In the preferred embodiment two monitors 73a are used, one mounted in the clean room wall 71 for the operators, and the other behind the wall 72 for the service technicians. Both monitors 73a simultaneously display the same information, but only one light pen 73b is enabled. The light pen 73b detects light emitted by the CRT display with a light sensor in the tip of the pen. To select a particular screen or function, the operator touches a designated area of the display screen and pushes the button on the pen 73b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 73b to allow the user to communicate with the processor.

Figure 12C:
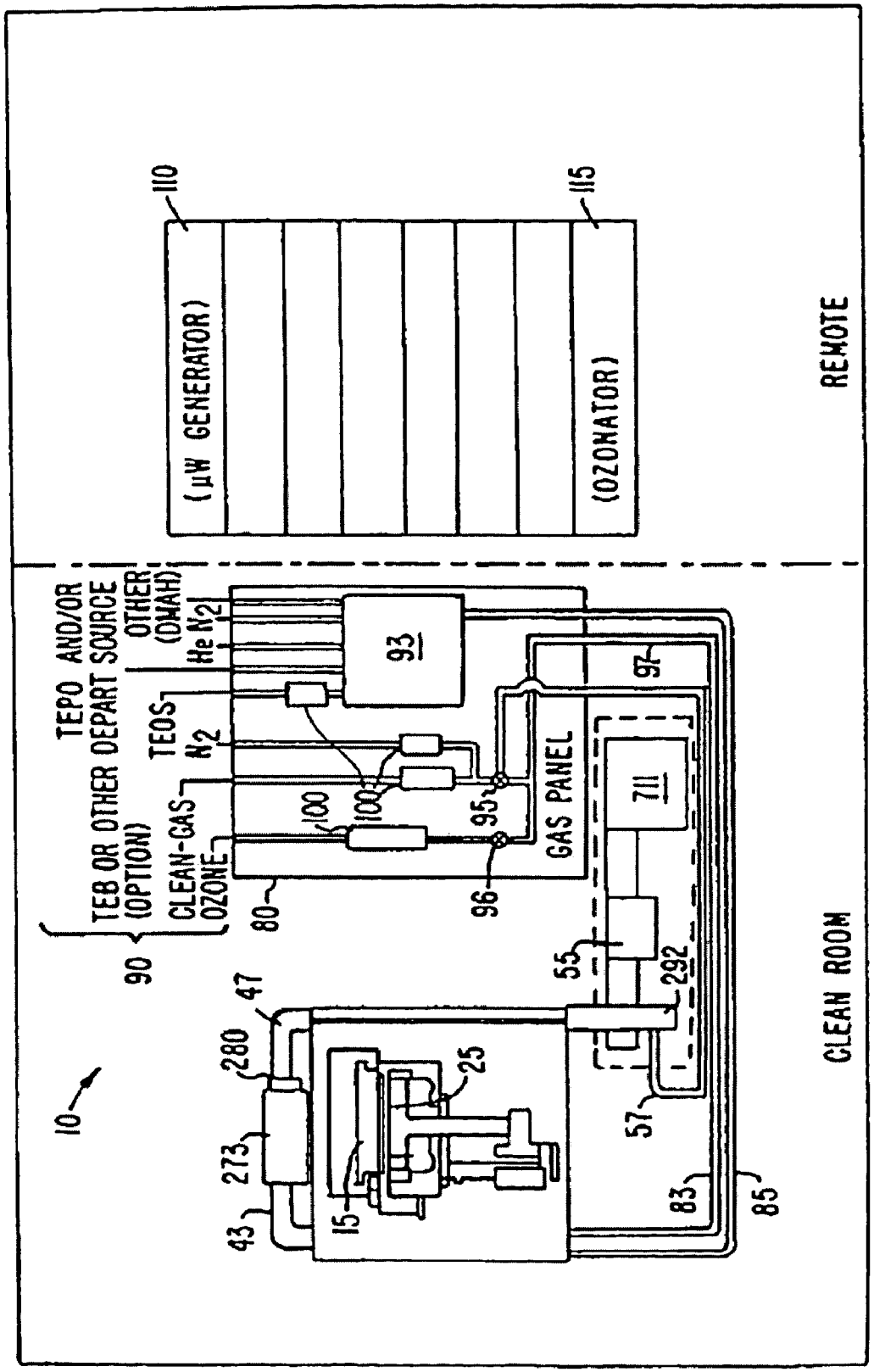
FIG. 12C is a simplified diagram of a gas panel and supply lines in relation to a deposition chamber.

FIG. 12C illustrates a general overview of an embodiment of the CVD apparatus 10 in relation to a gas supply panel 80 located in a clean room. As discussed above, the CVD system 10 includes a chamber 15 with a heater 25, a gas mixing box 273 with inputs from an inlet tube 43 and a conduit 47, and remote microwave plasma system 55 with input line 57. As mentioned above, the gas mixing box 273 is for mixing and injecting deposition gas(es) and clean gas(es) or other gas(es) through the inlet tube 43 to the processing chamber 15.

The remote microwave plasma system 55 is integrally located and mounted below the chamber 15 with the conduit 47 coming up alongside the chamber 15 to the gate valve 280 and the gas mixing box 273, located above the chamber 15. Microwave generator 110 and ozonator 115 are located remote from the clean room. Supply lines 83 and 85 from the gas supply panel 80 provide reactive gases to the gas supply line 43. The gas supply panel 80 includes lines from gas or liquid sources 90 that provide the process gases for the selected application. The gas supply panel 80 has a mixing system 93 that mixes selected gases before flow to the gas mixing box 273. In some embodiments, gas mixing system 93 includes a liquid injection system for vaporizing reactant liquids including silicon-containing precursors such as tetrammethylorthosilicate ("TMOS"), tetraethylorthosilicate ("TEOS"), octamethyltrisiloxane (OMTS), octamethylcyclotetrasiloxane (OMCTS), tetramethylcyclotetrasiloxane (TOMCATS), hydroxyl-containing precursors such as water, and hydrogen peroxide, and dopants such as triethylborate ("TEB"), triethylphosphate ("TEPO") and diborane ($B_2H_6$). Vapor from the liquids is usually combined with a carrier gas, such as helium. Supply lines for the process gases may include (i) shut-off valves 95 that can be used to automatically or manually shut off the flow of process gas into line 85 or line 57, and (ii) liquid flow meters (LFM) 100 or other types of controllers that measure the flow of gas or liquid through the supply lines.

As an example, a mixture including TEOS as a silicon source may be used with gas mixing system 93 in a deposition process for forming a silicon oxide film. The TEOS is a liquid source that may be vaporized by conventional boiler-type or bubbler-type hot boxes. However, a liquid injection system is preferred as it provides greater control of the volume of reactant liquid introduced into the gas mixing system. The liquid is typically injected as a fine spray or mist into the carrier gas flow before being delivered to a heated gas delivery line 85 to the gas mixing block and chamber. One or more sources, such as oxygen ($O_2$), ozone ($O_3$), NO or $NO_2$ flow to the chamber through another gas delivery line 83, to be combined with the reactant gases from heated gas delivery line 85 near or in the chamber. Of course, it is recognized that other sources of dopants, silicon, and oxygen also may be used.

Figure 12D:
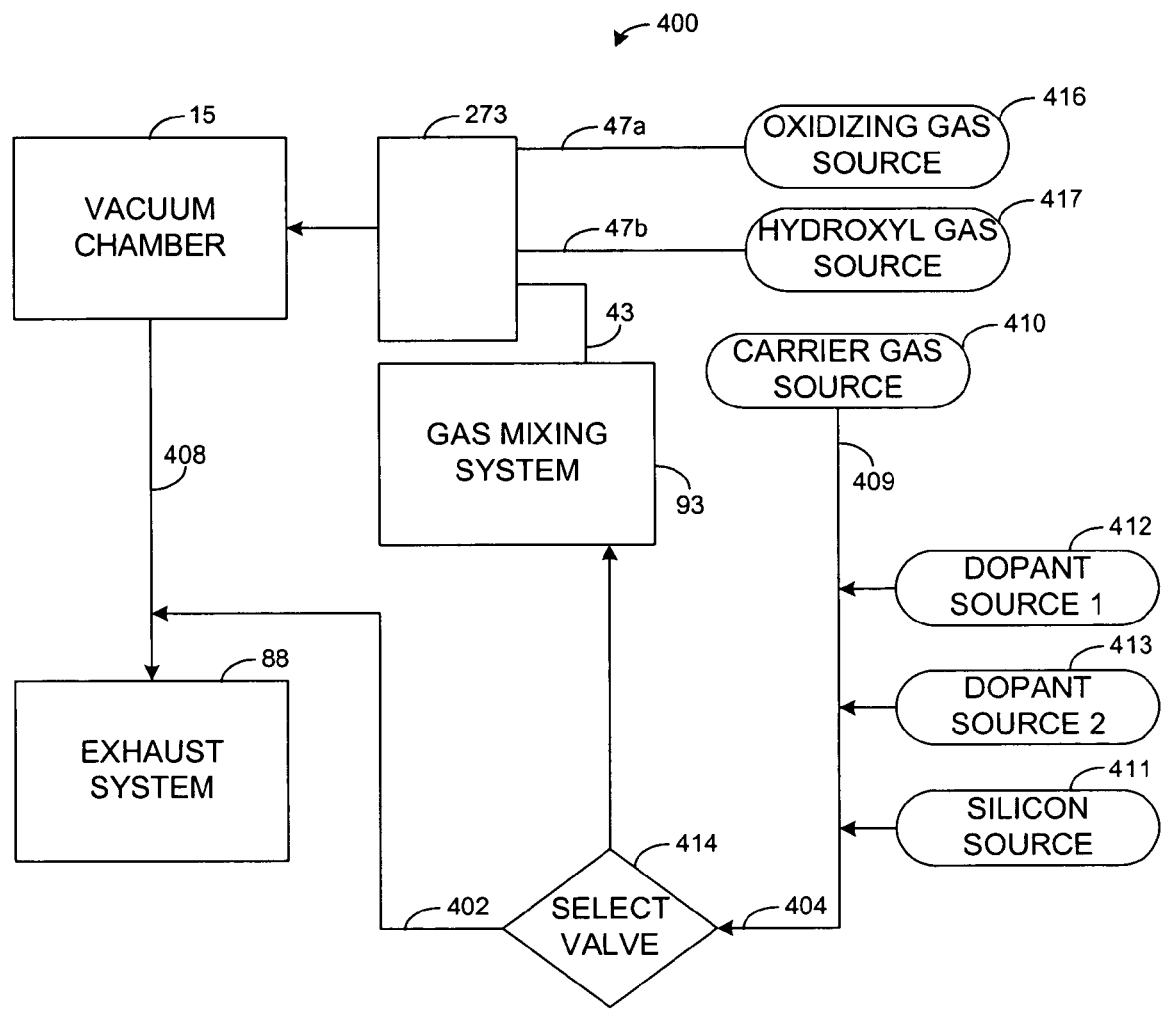
FIG. 12D shows a schematic view of another gas flow system in accordance with embodiments of the present invention.
Figure 7A:
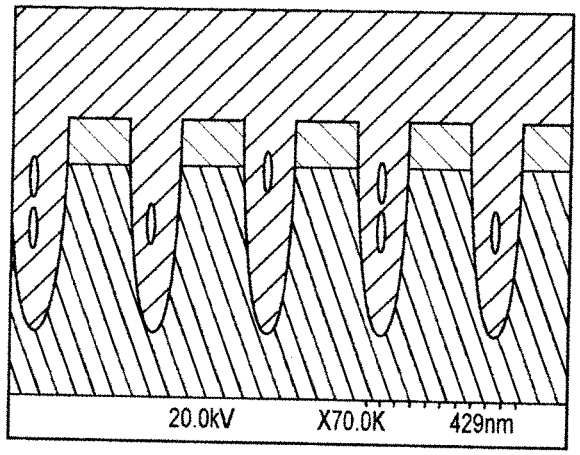
Figure 7B:
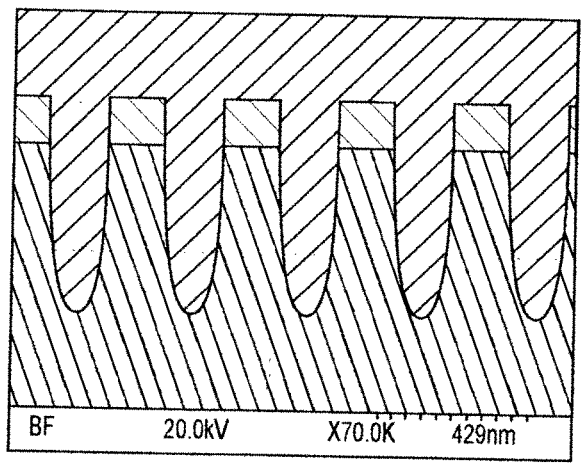
Figure 8A:
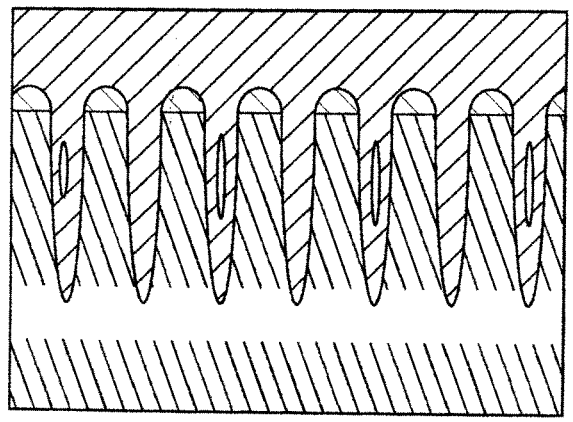
Figure 8B:
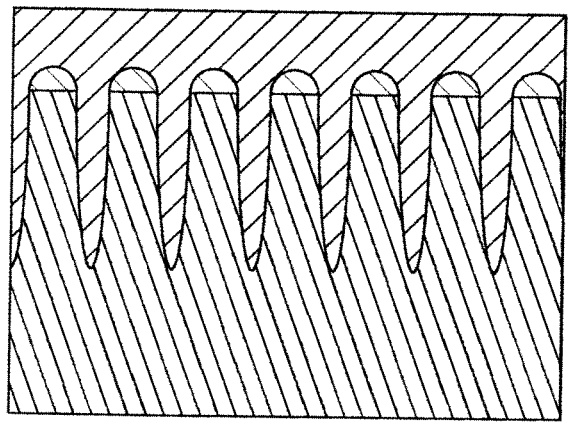

FIG. 12D is a simplified schematic diagram of a CVD deposition apparatus for depositing oxide layers in accordance with embodiments of the present invention. While the apparatus may be used to deposit silicon oxide films, it may also beneficially be applied to single-or multiple-layer doped silicon glass films, such as borophosphosilicate glass ("BPSG"), phosphosilicate glass ("PSG"), borosilicate glass ("BSG"), arsenic-silicon glass ("AsSG"), or similar films.

CVD deposition apparatus 400 comprises oxidizing gas source 416 and hydroxyl containing precursor source 417 in fluid communication with vacuum chamber 15 through gas mixing box 273. The oxidizing gas source 416 may contain oxygen ($O_2$), ozone ($O_3$), NO, $NO_2$, and mixtures of these gases, among other oxidizing gases. The hydroxyl containing precursor source 417 may contain $H_2O$, hydrogen peroxide ($H_2O_2$), and mixtures thereof, among other hydroxyl containing precursors. The hydroxyl containing precursors and oxidizing gases may be stored in sources 416 and 417 as liquids and/or gases.

Carrier gas source 410, silicon-containing gas source 411, first dopant gas (e.g., TEPO) source 412, and second dopant gas (e.g., TEB) source 413 are in fluid communication with vacuum chamber 15 through select valve 414 gas mixing system 93, and gas mixing box 273. Select valve 414 is selectively operable to shunt silicon- and dopant-containing gases such as TEOS vapor through divert line 402 to foreline 408 of chamber exhaust system 88, thereby circumventing vacuum chamber 15 entirely. Select valve 414 and divert line 402 allow the flow of silicon-containing gas to stabilize prior to its being routed to the vacuum chamber to commence an oxide CVD step in accordance with an embodiment of the present invention.

As noted above, the systems and methods of the invention may also be implemented on plasma based chemical vapor deposition systems. For example, the present invention may be used with plasma systems like the one described in commonly assigned U.S. Pat. No. 6,734,155, titled "PLASMA PROCESSES FOR DEPOSITING LOW DIELECTRIC CONSTANT FILMS," filed Aug. 27, 2002, and HDP-CVD systems like the one described in commonly-assigned U.S. Pat. No. 6,740,601, titled "HDP-CVD DEPOSITION PROCESSES FOR FILLING HIGH ASPECT RATIO GAPS," filed May 11, 2001, the entire contents of both patents being hereby incorporated by reference for all purposes.

While the above is a complete description of specific embodiments of the present invention, various modifications, variations, and alternatives may be employed. Alternative embodiments of process recipes in accordance with the present invention could call for flowing the silicon-containing component of the process gas flow at a sufficiently high initial concentration to allow the process gases to be introduced directly into the chamber, without an initial flow diversion phase.

Moreover, other techniques for varying the parameters of deposition of an oxide layer could be employed in conjunction with the variation in concentration of the process gas flow components described so far. Examples of other possible parameters to be varied include but are not limited to the temperature of deposition, the pressure of deposition, and the flow rate of processing gases containing dopants such as arsenic (As), boron (B), and phosphorous (P).

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

As used herein and in the appended claims, the singular forms "a", "and", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method to form a silicon oxide layer, the method comprising:
    providing a continuous flow of a silicon-containing precursor to a chamber housing a substrate, wherein the silicon-containing precursor is selected from the group consisting of OMTS;
    providing a flow of an oxidizing precursor comprising ozone to the chamber;
    causing a reaction between the silicon-containing precursor and the oxidizing precursor to form a silicon oxide layer; and
    increasing over time a ratio of the silicon-containing precursor: oxidizing precursor flowed into the chamber, by increasing a flow rate of the silicon-containing precursor relative to a flow rate of the oxidizing precursor to alter a rate of deposition of the silicon oxide on the substrate.

2. The method of claim 1, wherein varying the ratio of the silicon-containing precursor to the oxidizing precursor comprises increasing a flow rate of the silicon-containing precursor while the flow rate of the oxidizing gas remains constant.

3. The method of claim 1, wherein the silicon oxide is deposited within a recess in the substrate such that a conformal silicon oxide is initially formed within the recess at a first time, followed by formation of a less conformal silicon oxide at a second time.

4. The method of claim 3, wherein the recess comprises a shallow trench positioned between the expected location of adjacent semiconductor devices.

5. The method of claim 3, wherein the recess comprises a space between raised features on the substrate.

6. The method of claim 3, wherein the recess comprises a space between lines of an interconnect metallization structure.

7. The method of claim 1, wherein varying the ratio of the silicon-containing precursor to the oxidizing precursor results in a linear change in concentration of the silicon-containing precursor over time.

8. The method of claim 1, wherein varying the ratio of the silicon-containing precursor to the oxidizing precursor results in a nonlinear change in concentration of the silicon-containing precursor over time.

9. The method of claim 8, wherein the nonlinear change comprises a step-wise change in concentration of the silicon-containing precursor over time.

10. The method of claim 1 further comprising varying, during deposition of the oxide material, a spacing between the substrate and a precursor distribution plate introducing the precursors into the chamber.

11. The method of claim 10, wherein the spacing is reduced to enhance a rate of deposition of the silicon oxide.

12. The method of claim 1, further comprising diverting, prior to deposition, the flow of the silicon-containing precursor upstream of the chamber to an exhaust until a rate of the silicon-containing precursor flow has stabilized.

13. A method to form a silicon oxide layer, the method comprising:
    providing a continuous flow of a silicon-containing precursor to a chamber housing a substrate, wherein the silicon-containing precursor is selected from the group consisting of TMOS, TEOS, OMTS, OMCTS, and TOMCATS;
    providing a flow of an oxidizing precursor to the chamber;
    causing a reaction between the silicon-containing precursor and the oxidizing precursor to form a silicon oxide layer; and
    increasing over time a ratio of the silicon-containing precursor:oxidizing precursor flowed into the chamber, by increasing a flow rate of the silicon-containing precursor relative to a flow rate of the oxidizing precursor to alter a rate of deposition of the silicon oxide on the substrate, wherein the silicon oxide is deposited within a recess in the substrate such that a conformal silicon oxide is initially formed within the recess at a first time, followed by formation of a less conformal silicon oxide at a second time.

14. The method of claim 13, wherein the recess comprises a shallow trench positioned between the expected location of adjacent semiconductor devices.

15. The method of claim 13, wherein the recess comprises a space between raised features on the substrate.

16. The method of claim 13, wherein the recess comprises a space between lines of an interconnect metallization structure.

* * * * *

UNITED STATES PATENT AND TRADEMARK OFFICE
CERTIFICATE OF CORRECTION

PATENT NO. : 7,456,116 B2  
APPLICATION NO. : 11/018381  
DATED : November 25, 2008  
INVENTOR(S) : Ingle et al.

It is certified that error appears in the above-identified patent and that said Letters Patent is hereby corrected as shown below:

Delete Drawing Sheet 9 of 17, consisting of FIGS. 7A-7B, and substitute therefore the attached Drawing Sheet 9 of 17, consisting of the replacement FIGS. 7A-7B.

Delete Drawing Sheet 10 of 17, consisting of FIGS. 8A-8B, and substitute therefore the attached Drawing Sheet 10 of 17, consisting of the replacement FIGS. 8A-8B.

Signed and Sealed this  
Fourteenth Day of February, 2012

David J. Kappos  
*Director of the United States Patent and Trademark Office*